(12) United States Patent
Ohgami

(10) Patent No.: US 9,418,711 B2
(45) Date of Patent: Aug. 16, 2016

(54) SEMICONDUCTOR MEMORY DEVICE HAVING MAIN WORD LINES AND SUB-WORD LINES

(71) Applicant: MICRON TECHNOLOGY, INC., Boise, ID (US)

(72) Inventor: Takeshi Ohgami, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/509,932

(22) Filed: Oct. 8, 2014

(65) Prior Publication Data

US 2015/0098260 A1    Apr. 9, 2015

(30) Foreign Application Priority Data

Oct. 8, 2013  (JP) .................................. 2013-211374

(51) Int. Cl.
*G11C 5/02* (2006.01)
*G11C 8/10* (2006.01)
*G11C 8/14* (2006.01)

(52) U.S. Cl.
CPC *G11C 5/025* (2013.01); *G11C 5/02* (2013.01); *G11C 8/10* (2013.01); *G11C 8/14* (2013.01)

(58) Field of Classification Search
CPC .................................... G11C 5/02; G11C 8/08
USPC ............................... 365/51, 230.06
See application file for complete search history.

(56) References Cited

U.S. PATENT DOCUMENTS

| | | | |
|---|---|---|---|
| 6,535,435 B2 * | 3/2003 | Tanaka | G11C 5/145 257/E27.097 |
| 6,747,509 B2 * | 6/2004 | Horiguchi | G11C 5/14 327/544 |
| 7,842,976 B2 * | 11/2010 | Fujii | H01L 27/0207 257/206 |
| 2011/0026290 A1 * | 2/2011 | Noda | G11C 5/025 365/51 |

FOREIGN PATENT DOCUMENTS

JP    2012-243341    12/2012

* cited by examiner

*Primary Examiner* — Michael Tran
(74) *Attorney, Agent, or Firm* — Dorsey & Whitney LLP

(57) ABSTRACT

A plurality of memory mats classified into groups selected by bits of a row address, a main word driver for selecting a main word line based on bits of the row address, an FX driver for selecting a word driver selecting line based on bits regardless of the bits of the row address, and a plurality of sub-word drivers selected by the main word line and the word driver selecting line to drive the corresponding sub-word line are arranged.

16 Claims, 27 Drawing Sheets

SEMICONDUCTOR MEMORY DEVICE HAVING MAIN WORD LINES AND SUB-WORD LINES

RELATED REFERENCE

This application is based upon and claims the benefit of priority from Japanese Patent Application No. 2013-211374 filed on Oct. 8, 2013, the disclosure of which is incorporated herein in its entirety by reference.

BACKGROUND

1. Field of the Invention

The present invention relates to semiconductor devices, and in particular, to a semiconductor device including hierarchically structured word lines.

2. Description of Prior Art

A semiconductor memory device represented by a DRAM (Dynamic Random Access Memory) generally includes hierarchically structured main word lines and sub-word lines. The main word line is a word line positioned at an upper hierarchy, and is selected by an upper bit of a row address. The sub-word line is a word line positioned at a lower hierarchy, and is selected based on a corresponding main word line and a word driver selecting line selected by a lower bit of the row address (Japanese Patent Application Laid Open No. 2012-243341).

A memory cell array such as the DRAM is generally divided into a plurality of memory mats to reduce the wiring capacity of the sub-word line and the bit line. The memory mat refers to an extending range of the sub-word line and the bit line. The main word line described above is assigned in plurals to one memory mat, so that when the main word line is selected using the upper bit of the row address, the memory mat to be selected is also determined at the same time.

The selection of the word driver selecting line, in principle, merely uses only the lower bit of the row address. Actually, however, not only the lower bit of the row address, but a part of the upper bit of the row address is also used. This is because if only the lower bit of the row address is used, one word driver selecting line needs to be made common with respect to all the memory mats, in which case, the wiring capacity becomes very large and thus is not realistic.

Actually, the word driver selecting line is divided, and one word driver selecting line is commonly assigned to multiple (e.g., two) memory mats to reduce the wiring capacity. Thus, not only is the lower bit of the row address used, but information for specifying the memory mat, for example, a part of the upper bits of the row address is also used for the selection of the word driver selecting line.

However, if the number of hits of the upper bits of the row address used for the selection of the word driver selecting line is large, the logic for selecting the word driver selecting line becomes complex and the circuit scale increases. Such problems are particularly significant when the number of memory mats cannot be expressed by power of two.

SUMMARY

A device includes a plurality of memory mats arranged on a first line in a first direction, and a plurality of word driver selection lines each including a first wiring extending in a second direction perpendicular to the first direction and a second wiring extending on a second line in the first direction, each of the second wirings of the plurality of word driver selection lines being provided to segment the plurality of memory urns into a plurality of groups of the memory mats, each of the plurality of groups of the memory mats including four mats, so that each of the plurality of word driver selection lines access to the plurality of memory mats by the respective four memory mats.

According to the present invention, the word driver selecting line and the group of the memory mat are associated so that the bit of the address used for the selection of the word driver selecting line is reduced, whereby the circuit configuration of the driver circuit for selecting the word driver selecting line can be simplified.

DETAILED DESCRIPTION OF THE EMBODIMENTS

Preferred embodiments of the present invention will be hereinafter described in detail while referencing the accompanying drawings.

Figure 1:
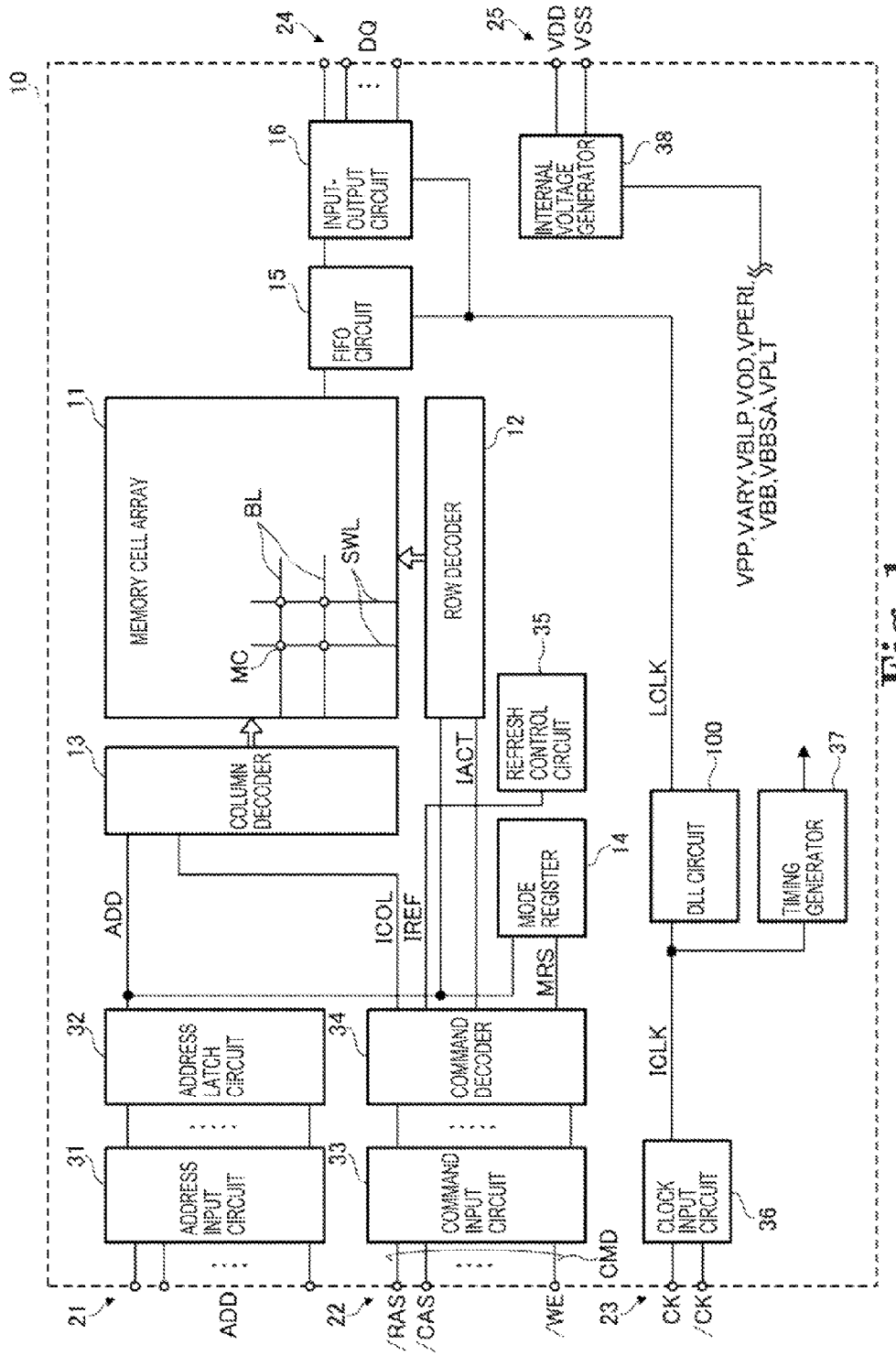
FIG. 1 is a block diagram showing an overall configuration of a semiconductor device according to an exemplary embodiment of the present invention.

FIG. 1 is a block diagram showing an overall configuration of a semiconductor device 10 according to an exemplary embodiment of the present invention.

The semiconductor device 10 is a DRAM integrated on a single semiconductor chip, and includes a memory cell array 11. The memory cell array 11 includes a plurality of sub-word lines SWL and a plurality of hit lines BL, and has a configuration in which a memory cell MC is arranged at the intersection of the sub-word line and the bit line. The sub-word line SWL is selected by a row decoder 12, and the bit line BL is selected by a column decoder 13.

As shown in FIG. 1, the semiconductor device 10 includes an address terminal 21, a command terminal 22, a clock terminal 23, a data terminal 24 and a power supply terminal 25 as external terminals.

The address terminal 21 is a terminal to which an address signal ADD is externally input. The address signal ADD input to the address terminal 21 is provided to art address latch circuit 32 through an address input circuit 31, and latched by the address latch circuit 32. The address signal ADD latched by the address latch circuit 32 is provided to the row decoder 12, the column decoder 13 or a mode register 14. The mode register 14 is a circuit set with a parameter indicating an operation mode of the semiconductor device 10.

The command terminal 22 is a terminal to which a command signal CMD is externally input. The command signal CMD includes a plurality of signals such as a row address strobe signal/RAS, a column address strobe signal/CAS, a light enable signal/WE, and the like. If slash (/) is given to the head of the signal name, this means that an inverted signal of the corresponding signal or the relevant signal is a low active signal. The command signal CMD input to the command terminal 22 is provided to a command decoder 34 through a command input circuit 33. The command decoder 34 is a circuit that generates various types of internal commands by decoding the command signal CMD. The internal command includes an active signal IACT, a column signal ICOL, a refresh signal IREF, a mode register set signal MRS and the like.

The active signal TACT is a signal that is activated when the command signal CMD indicates row access (active command). When the active signal IACT is activated, the address signal. ADD latched by the address latch circuit 32 is provided to the row decoder 12. The sub-word line SWL specified by the address signal ADD is thereby selected.

The column signal ICOL is a signal that is activated when the command signal CMD indicates a column access (read command or write command). When the internal column signal ICOL is activated, the address signal ADD latched by the address latch circuit 32 is provided to the column decoder 13. The bit line BL specified by the address signal ADD is thereby selected.

Therefore, if the active command and the read command are input in such order and the row address and the column address are input in synchronization therewith, the read data is read out from the memory cell MC specified by the row address and the column address. The read data DQ is output to the outside from the data terminal 24 through a FIFO circuit 15 and an input-output circuit 16. On the other hand, if the active command and the write command are input in such order and the row address and the column address are input in synchronization therewith, and then the write data DQ is input to the data terminal 24, the write data DQ is provided to the memory cell array 11 through the input-output circuit 16 and the FIFO circuit 15, and written to the memory cell MC specified by the row address and the column address. The operations of the FIFO circuit 15 and the input-output circuit 16 are carried out in synchronization with the internal clock signal LCLK. The internal clock signal LCLK is generated by a DLL circuit 100.

The refresh signal IREF is a signal that is activated when the command signal CMD indicates a refresh command. When the refresh signal IREF is activated, the row access is carried, out by the refresh control circuit 35 and a predetermined sub-word line SWL is selected. A plurality of memory cells MC connected to the selected sub-word line SWL is thereby refreshed. The sub-word line SWL is selected by a refresh counter (not shown) arranged in the refresh control circuit 35.

The mode register set signal MRS is a signal that is activated when the command signal CMD indicates a mode register set command. Therefore, when the mode register set command is input and the mode signal is input from the address terminal 21 in synchronization therewith, the set value of the mode register 14 can be rewritten.

The clock terminal 23 is a terminal to which external clock signals CK, /CK are input. The external clock signal CK and the external clock signal /CK are signals complementary to each other, and are both provided to the clock input circuit 36. The clock input circuit 36 generates an internal clock signal CLK based on the external clock signals CK, /CK. The internal clock signal ICLK is provided to a timing generator 37, whereby various types of internal clock signals are generated. The various types of internal clock signals generated by the timing generator 37 are provided to circuit blocks such as the address latch circuit 32, the command decoder 34, and the like to define the operation timing of such circuit blocks.

The internal clock signal ICLK is also provided to the DLL circuit 100. The DLL circuit 100 is a clock generation circuit that generates an internal clock signal LCLK that is phase controlled based on the internal clock signal ICLK. As described above, the internal clock signal LCLK is provided to the ELM circuit 15 and the input-output circuit 16. The read data DQ is thus output in synchronization with the internal clock signal LCLK.

The power supply terminal 25 is a terminal to which power supply potentials VDD, VSS are supplied. The power supply potentials VDD, VSS supplied to the power supply terminal 25 are supplied to an internal voltage generator 38. The internal voltage generator 38 generates various types of internal potentials VPP, VARY, VBLP, VOD, VPERI, VBB, VBBSA, VPLT, and the like based on the power supply potentials VDD, VSS. The internal potentials VPP, VBB are potentials mainly used in the row decoder 12, the internal potentials VARY, VBLP, VOD, VBBSA, VPLT are potentials mainly used in the memory cell array 11, and the internal potential VPERI is a potential used in many other circuit blocks.

Figure 2:
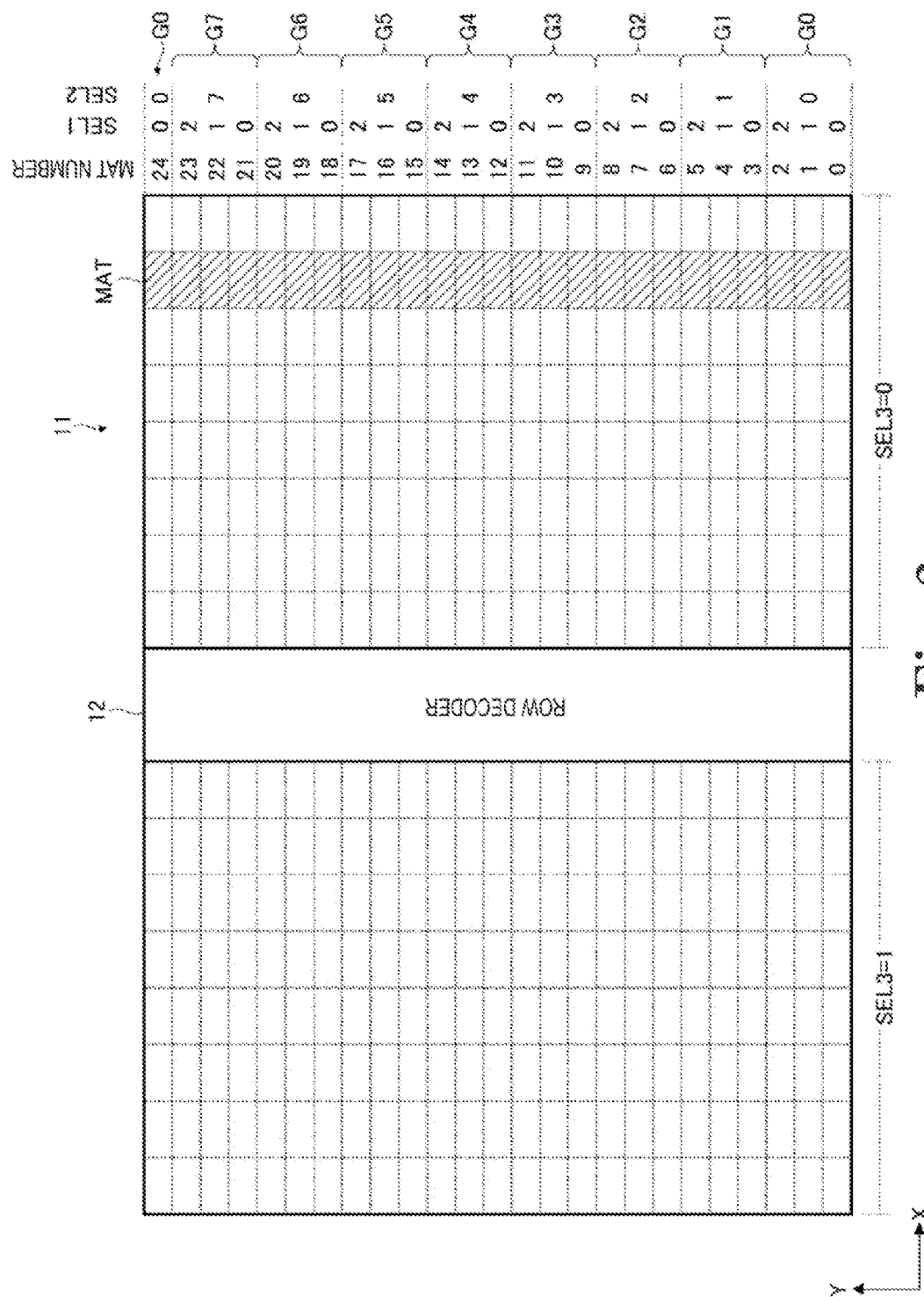
FIG. 2 is a schematic plan view describing a configuration of the memory cell array according to the first embodiment.

FIG. 2 is a schematic plan view describing a configuration of the memory cell array 11 according to the first embodiment.

As shown in FIG. 2, the memory cell array 11 includes a plurality of memory mats MAT arranged in a matrix form. The memory mat is a range in which the sub-word line SWL and the bit line BL are extended. In the present embodiment, 16 memory mats MAT and 25 memory mats MAT are laid out in a matrix form in an X direction and a Y direction, respectively, and the row decoder 12 is arranged at a central part in the X direction. The memory mat group on which side when viewed from the row decoder 12 to select is specified by a selecting signal SEL3. The selecting signal SEL3 is as signal of one bit, and the memory mat group on the right side or the left side when viewed from the row decoder 12 is selected according to the logic level of the signal. Furthermore, which memory mat of the memory mat group selected by the selecting signal SEL3 to select is specified by selecting signals SEL1, SEL2.

More specifically, assuming 25 memory mats arrayed in the Y direction are MAT0 to MAT24, the 25 memory mats are grouped into eight groups. Among such groups, the group G0 includes four memory mats MAT0 to MAT2, and mat MAT24, and the other groups G1 to G7 include three memory mats (e.g. MAT3 to MAT5). The group G0 includes four memory mats because the memory cell array 11 according to the present embodiment has as so-called open bit line type layout, and the memory mats MAT0, MAT24 positioned at the ends in the Y direction only have a storage capacity of ½ of the other memory mats. Therefore, the memory mats MAT0, MAT24 positioned at the ends together correspond to the capacity of one typical mat, and as a result, group G0 to G7 has the same storage capacity with respect to each other.

The groups G0 to G7 are selected by the selecting signal SEL2. The selecting signal SEL2 is a signal of eight bits (SEL2$_0$ to SEL2$_7$), where each bit corresponds to a respective one of the groups G0 to G7.

Which memory mat to select from the group G0 to G7 is specified by the selecting signal SEL1. The selecting signal SEL1 is a signal of three bits (SEL1$_0$ to SEL1$_2$), where each bit corresponds to a respective one of the three memory mats in a group. With respect to the memory mats MAT0, MAT24 positioned at the ends, the selecting signal SEL1$_0$ n assigned to both memory mats so that the memory mats MAT0, MAT24 are selected simultaneously.

The selection of the memory mat MAT is thus carried out using the selecting signals SEL1 to SEL3. In each memory mat group arranged on both sides of the row decoder 12, eight memory mats arrayed in the X direction are selected simultaneously. Although the data read out from such eight memory mats are selected based on the column address, the column access is not directly relevant to describing embodiments of the present invention and thus the description thereof will be omitted. Therefore, the description will be made below focusing on the 25 memory mats MAT0 to MAT24 (e.g., hatched portion in FIG. 2) arrayed in the Y direction.

Which sub-word line SWL in the selected memory mat to select is specified based on a main word signal and a word driver selecting, signal FX, to be described later. Although the details will be described hereinafter, the word driver selecting signal FX is generated based on the selecting signals SEL0, SEL2. Similar to the selecting signal SEL2, the selecting signal SEL0 is a signal of tight bits (SEL0$_0$ to SEL0$_7$). Therefore, the word driver selecting signal FX is 64 bits (=8×8), and one of the bits is activated. In the present specification and the drawings, the reference symbol FX is also sometimes denoted on the word driver selecting line for transmitting the word driver selecting signal FX.

Figure 3:
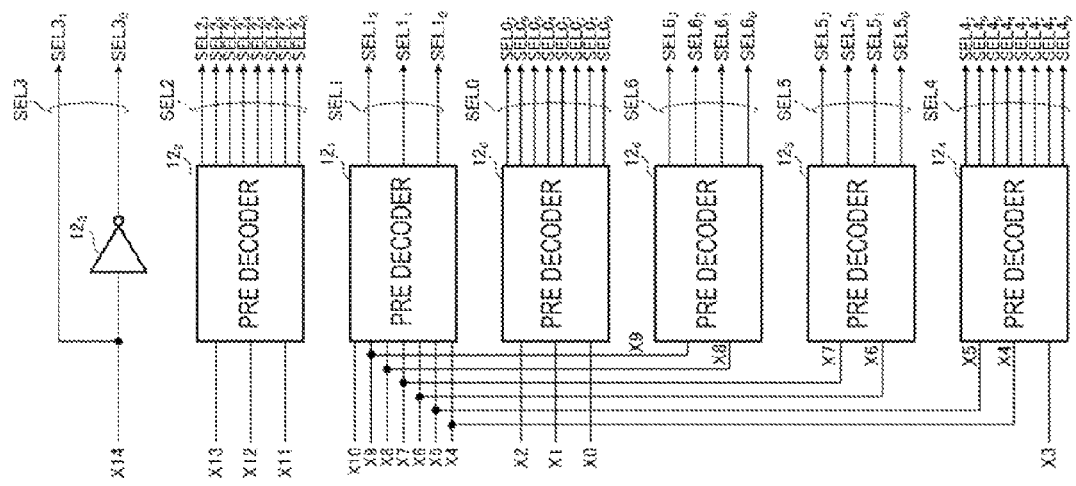
FIG. 3 is a block diagram showing pre-decoders arranged in a row decoder according to an embodiment of the invention.

FIG. 3 is a block diagram showing pre-decoders arranged in the row decoder 12.

As shown in FIG. 3, the row decoder 12 includes six pre-decoders 12$_0$ to 12$_2$, 12$_4$ to 12$_6$ and an inverter circuit 12$_3$. The inverter circuit 12$_3$ is a circuit that generates the selecting signal SEL3$_0$, and receives a most significant bit X14 of the row address (X0 to X14). The most significant bit X14 is used as is for the selecting signal SEL3$_1$. Therefore, the memory mat group on which side when viewed from the row decoder 12 to select is determined by the bit X14 of the row address.

The pre-decoders 12$_0$ to 12$_2$, 12$_4$ to 12$_6$ generates selecting signals SEL0 to SEL2, SEL4 to SEL6, respectively. Among the pre-decoders, the pre-decoder 12$_2$ receives the bits X11 to X13 of the row address and decodes such bits to activate any one bit of the signal SEL2$_0$ to SEL2$_7$ of eight bits configuring the selecting signal SEL2. Therefore, the selection of the group G0 to G7 is determined by the bits X11 to X13 of the row address.

The pre-decoder 12$_1$ receives the bits X4 to X10 or the row address and decodes such bits to activate any one bit of the signal SEL1$_0$ to SEL1$_2$ of three bits configuring the selecting signal SEL1. The has X4 to X10 of the row address are required to generate the signal SEL1$_0$, to SEL1$_2$ of three bits since the number of memory mats configuring, each group G0 to G7 is three, which is a number that cannot be expressed by power of two.

The number of memory mats configuring each group G0 to G7 is set to three due to the design that takes into consideration the hit line capacity. For example, if the number of sub-word lines SWL arranged in one group is 2048 (=$2^{11}$) (not including redundant sub-word lines, this is the same hereinafter), 512 (=$2^9$) sub-word lines SWL are assigned with respect to one bit line BL if one group is divided into four memory mats MAT, and 1024 (=$2^{10}$) sub-word lines SWL are assigned with respect to one bit line BL if one group is divided into two memory mats MAT. In such cases, the number of bits of the row address required to generate the selecting signal SEL1 becomes very small, but the occupying area increases as the number of sub-word drivers is large in the former dividing method, and the access speed lowers as the bit line capacity is large in the latter dividing method. As a compromising plan, one group is divided into three memory mats MAT. Specifically, when dividing one group into three memory mats MAT, 688 sub-word lines SWL are assigned with respect to one bit line BL for two memory mats MAT, and 672 sub-word lines SWL are assigned with respect to one bit line BL for one memory mat MAT. Thus, when one group is divided into three memory mats MAT, even the number of sub-word lines SWL arranged in one memory mat MAT becomes a number that cannot be expressed by power of two.

The pre-decoder 12$_0$ receives the bits X0 to X2 of the row address and decodes such bits to activate any one bit of the signal SEL0$_0$ to SEL0$_7$ of eight bits configuring the selecting signal SEL0. As described above, the selecting signal SEL0 is used for the generation of the word driver selecting signal FX.

The pre-decoder 12$_4$ receives the bits X3 to X5 of the row address and decodes such bits to activate any one bit of the signal of eight bits configuring the selecting signal SEL4. The pre-decoder 12$_5$ receives the bits X6 and X7 of the row address and decodes such bits to activate any one bit of the signal of four bits configuring the selecting signal SEL5. The pre-decoder 12$_6$ receives the bits X8 to X9 of the row address and decodes such bits to activate any one bit of the signal of four bits configuring the selecting signal SEL6.

Figure 4:
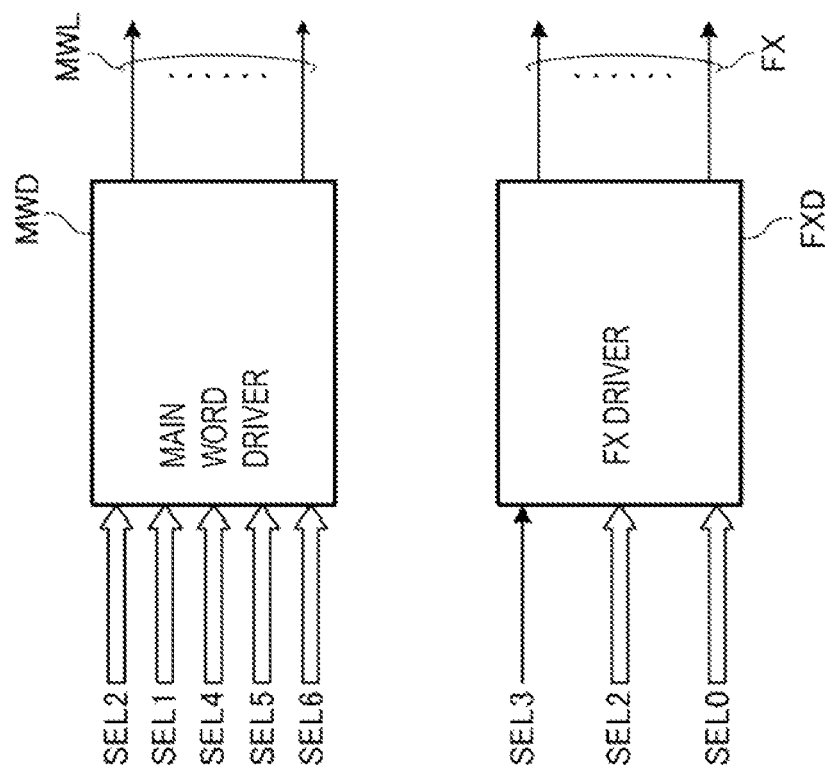
FIG. 4 is a block diagram showing a main word driver and a driver arranged in the row decoder according to an embodiment of the invention.

FIG. 4 is a block diagram showing a main word driver and an FX driver arranged in the row decoder 12.

As shown in FIG. 4, the main word driver MWD receives the selecting signals SEL1, SEL2, and SEL4 to SEL6, and selects one of as plurality of main word lines MWL based thereon. The selecting signal SEL3 is not input to the main word driver MWD because one main word line MWL is commonly assigned with respect to the memory mat group arranged on both sides (SEL3=0 and SEL3=1) of the row decoder 12 shown in FIG. 2. Upon receiving the selecting signals SEL0, SEL2, and SEL3, the FX driver FXD selects one of a plurality of word driver selecting lines FX based on the selecting signals. In the present embodiment, the selecting signal SEL1 is not input to the FX driver FXD. Furthermore, the selecting signal SEL2 is input to the FX driver FXD because the word driver selecting line FX is shared in units of groups, as will be described later.

Figure 5:
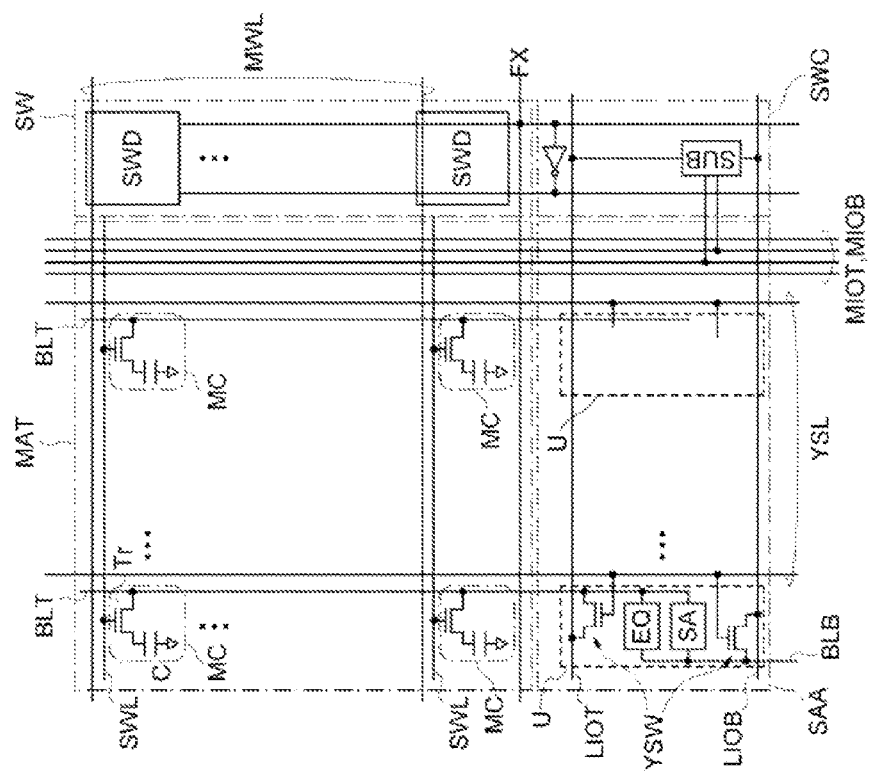
FIG. 5 is a substantially plan view showing a part of the memory cell array according to an embodiment of the invention.

FIG. 5 is a substantially plan view showing a part of the memory cell array 11 in a more enlarged manner.

As shown in FIG. 5, local I/O lines LIOT, LIOB extending in the X direction and main I/O lines MIOT, MIOB extending in the Y direction are arranged in the memory cell array 11. The local I/O lines LIOT, LIOB and the main I/O lines MIOT, MIOB are hierarchically structured I/O lines.

The local I/O lines LIOT, LIOB are used to transmit the read data read out from the memory cell MC in the memory cell array. The local I/O lines LIOT, LIOB are differential type I/O lines for transmitting the read data using a pair of wirings. The local I/O lines LIOT, LIOB are laid out in the X direction on a sense amplifier region SAA and to sub-word cross region SWC.

The main I/O lines MIOT, MIOB are used to transmit the read data from the memory cell array 11 to a main amplifier (not shown). The main I/O lines MIOT, MIOB are also differential type I/O lines for transmuting the read data using a pair of wirings. The main I/O lines MIOT, MIOB are laid out in the Y direction on the memory mat MAT and the sense amplifier region SAA. A plurality of main I/O lines MIOT, MIOB extending in the Y direction are arranged in parallel and connected to the main amplifier.

In the memory mat MAT, the memory cell MC is arranged at an intersection of the sub-word line SWL and the bit line BLT or BLB. The memory cell MC has a configuration in which a cell transistor Tr and a cell capacitor C are connected in series between the corresponding bit line BLT or BLB and the plate wiring (wiring to which plate potential VPLT is supplied). The cell transistor Tr includes an N-channel MOS transistor, and a gate electrode of which is connected to the corresponding sub-word line SWL.

The sub-word driver region SW includes a plurality of sub-word drivers SWD. Each sub-word driver SWD drives the corresponding sub-word line SWL based on the row address.

The main word line MWL and the word driver selecting line FX are connected to the sub-word driver SWD. For example, eight word driver selecting lines FX are wired on one sub-word driver SWD, and one of the four sub-word drivers SWD selected with one main word line MWL is selected by a pair of word driver selecting lines FX so that the one sub-word line SWL is activated to the selecting potential VPP.

In the sense amplifier region SAA, a unit U including a sense amplifier SA, an equalize circuit EQ, and a column switch YSW is arranged in plurals. Each sense amplifier SA and each equalize circuit EQ are connected to the corresponding bit hue pair BLT, BLB. The sense amplifier SA amplifies the potential difference generated in the hit line pair BLT, BLB, and the equalize circuit EQ equalizes the bit line pair BET, BLB to the same potential (pre-charge potential VBLP). In the present embodiment, the open bit line type is adopted, and thus the bit line BLT and the bit line BLB connected to the same sense amplifier SA are arranged in the memory mats MAT different from each other. The read data amplified by the sense amplifier SA is first transmitted to the local I/O lines LIOT, LIOB, and then further transmitted to the main I/O lines MIOT, MIOB.

The column switch YSW is arranged between the corresponding sense amplifier SA and the local I/O lines LIOT, LIOB, and connects the sense amplifier SA and the local I/O line when a corresponding column selecting line YSL is activated to high level. One end of the column selecting line YSL is connected to the column decoder 13, and the column selecting line YSL is activated based on the column address.

A plurality of sub-amplifiers SUB is arranged in the sub-word cross region SWC. The sub-amplifier SUB is arranged in plurals for every sub-word cross region SWC, and drives the corresponding main I/O line MIOT, MIOB. An input end of each sub-amplifier SUB is connected to the corresponding local I/O line LIOT, LIOB pair, and an output end of each sub-amplifier SUB is connected to the corresponding main I/O line MIOT, MIOB. Each sub-amplifier SUB drives the main I/O line MIOT, MIOB based on the data on the corresponding local LIOT, LIOB.

As described above, the main I/O lines MIOT, MIOB are arranged to transverse the memory mat MAT. One end of each main I/O line MIOT, MIOB is connected to a main amplifier (not shown). Thus, the data read out with the sense amplifier SA is transferred, to the sub-amplifier SUB through the local I/O lines LIOT, LIOB, and flintier transmitted to the main amplifier through the main I/O lines MIOT, MIOB. The main amplifier further amplifies the data provided through the main I/O lines MIOT, MIOB, and transfers the same to the FIFO circuit 15 shown in FIG. 1.

Figure 6:
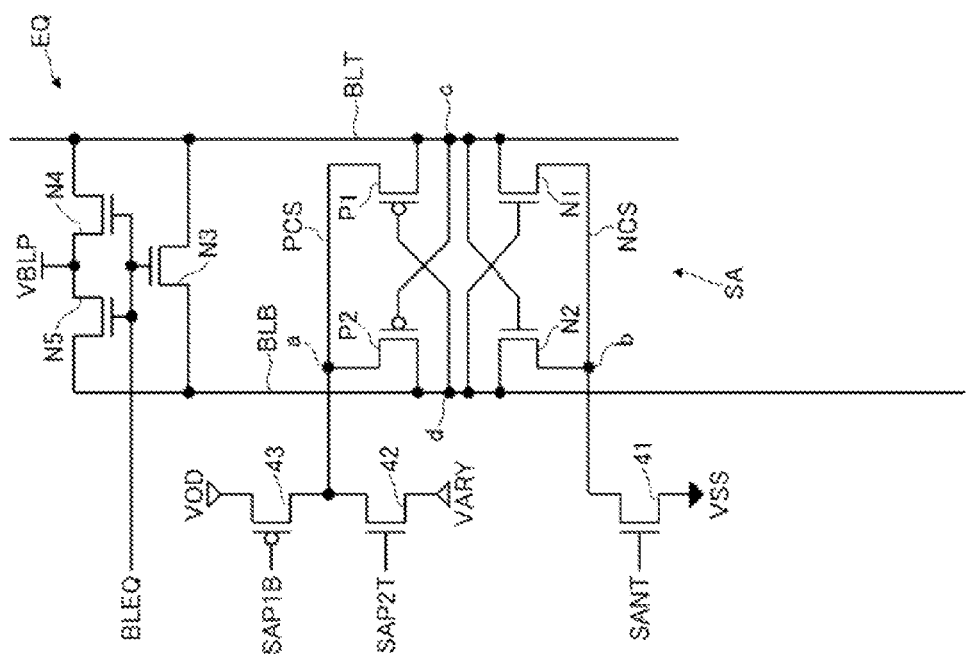
FIG. 6 is a circuit diagram of a sense amplifier and an equalize circuit according to an embodiment of the invention.

FIG. 6 is a circuit diagram of the sense amplifier SA and the equalize circuit EQ.

As shown in FIG. 6, the sense amplifier SA is configured by p-channel MOS transistors P1, P2 and n-channel MOS transistors N1, N2. The transistors P1, N1 are connected in series between common source nodes a, b, where a contact point of the transistors P1, N1 is connected to one signal node c, and the gate electrodes of the transistors P1, N1 are connected to the other signal node d. Similarly, the transistors P2, N2 are also connected in series between common source nodes a, b, where a contact point of the transistors P2, N2 is connected to one signal node d, and the gate electrodes of the transistors P2, N2 are connected to the other signal node c. The common source node a is connected to a common source wiring PCS on a high potential side, and the common source node b is connected to a common source wiring NCS on a low potential side. The signal node c is connected to the bit line BLT, and the signal node d is connected to the bit line BLB.

According to such flip-flop structure, when a potential difference is created in the bit line pair BLT, BLB while a predetermined active potential is being supplied to the common source wiring PCS on the high potential side and the common source wiring NCS on the low potential side, the potential of the common source wiring PCS on the high potential side is supplied on one of the bit line pair, and the potential of the common source wiring NCS on the low potential side is supplied to the other one of the bit line pair. The active potential of the common source wiring PCS on the high potential side is the array potential VARY, and the active potential of the common source wiring NCS on the low potential side is the ground potential VSS. However, at the beginning of the sense operation, the over drive potential VOD, which is higher than the array potential VARY, is temporarily supplied to the common source wiring PCS thus enhancing the sense speed.

An n-channel MOS transistor 41 is connected to the common source wiring NCS, where the ground potential VSS is supplied to the common source wiring NCS when a control signal SANT is activated. Furthermore, an n-channel MOS transistor 42 and a p-channel MOS transistor 43 are connected to the common source wiring PCS, where the over drive potential VOD is supplied to the common source wiring PCS when a control signal SAP1B is activated, and the array potential VARY is supplied to the common source wiring PCS when a control signal SAP2T is activated.

At the time point before carrying out the sense operation, the bit line pair BLT, BLB is equalized to the pre-charge potential VBLP by the equalize circuit EQ in advance. When a predetermined sub-wend line SWL is selected after stopping the equalization, the charges held in the memory cell MC are released to the hit line BLT or BLB, and as a result, a potential difference is created between the bit lines BLT, BLB. Thereafter, when the active potential is supplied to the common source wirings PCS, NCS, the potential difference of the bit line pair BLT, BLB is amplified.

The equalize circuit EQ includes three n-channel MOS transistors N3 to N5. The transistor N3 is connected between the bit line pair BLT, BLB, the transistor N4 is connected between the bit line BLT and the power supply wiring, to which the pre-charge potential VBLP is supplied, and the transistor N5 is connected between the hit line BLB and the power supply wiring, to which the pre-charge potential VBLP is supplied. A hit line equalize signal, BLEQ is provided to all of the gate electrodes of the transistors N3 to N5. According to such configuration, when the bit line equalize signal BLEQ is activate to high level, the bit line pair BLT, BLB is pre-charged to the pre-charge potential VBLP. A potential higher than the array potential VARY is preferably used for the active potential of the bit line equalize signal BLEQ. The ground potential VSS is used for a de-active potential of the bit line equalize signal BLEQ.

Figure 7:
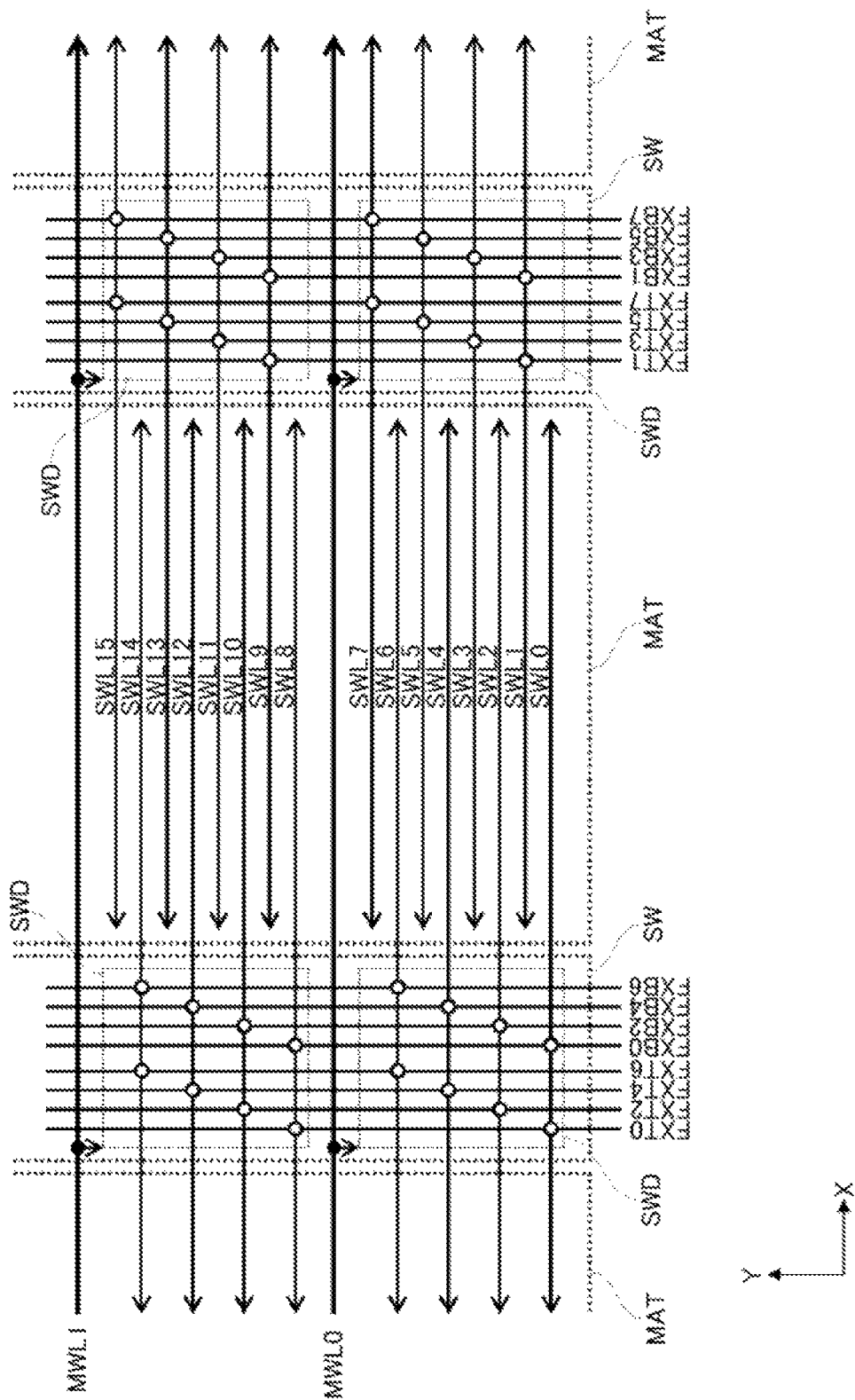
FIG. 7 is a schematic view describing a relationship of a main word line and a word driver selecting line, and the sub-word line according to an embodiment of the invention.

FIG. 7 is a schematic view describing a relationship of the main word fine MWL and the word driver selecting line FX, and the sub-word line SWL.

Each word driver selecting line FX includes complementary wirings FXT, FXB, where word driver selecting lines FXT0 to FXT7, FXB0 to FXB7 for eight bits extending in the V direction are shown in FIG. 7. Among such word driver selecting lines, the even-numbered word driver selecting lines FXT0, 2, 4, 6. FXB0, 2, 4, 6 are connected to the sub-word driver SWD arranged on one side (left side) in the X direction of the memory mat MAT, and the odd-numbered word driver selecting lines FXT1, 3, 5, 7, FXB1, 3, 5, 7 are connected to the sub-word driver SWD arranged on the other side (right side) in the X direction of the memory mat MAT.

Furthermore, the same main word line MWL is connected to the sub-word drivers SWD having substantially the same coordinate in the Y direction among the sub-word drivers SWD arranged in different sub-word driver regions SW. In FIG. 7, two sub-word drivers SWD connected to the main word line MWL0, and two sub-word drivers SWD connected to the main word line MWL1 are shown.

According to such configuration, one of the sub-word lines SWL is selected according to the activated main word line MWL and the activated word driver selecting line FX. For example, if the main word line MWL0 and the word driver selecting line FX0 (=FXT0, FXB0) are activated, the sub-word line SWL0 corresponding thereto is selected.

Figure 8:
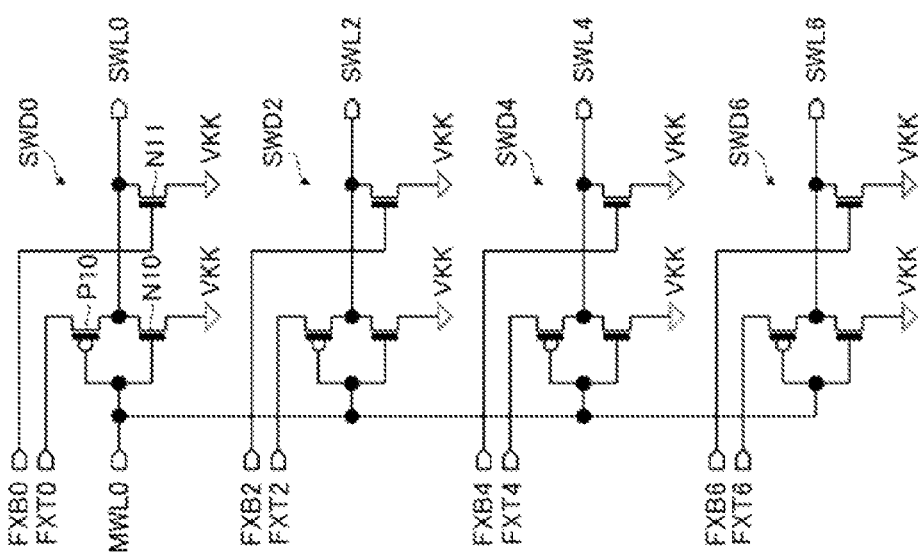
FIG. 8 is a circuit diagram of a sub-word driver according to an embodiment of the invention.

FIG. 8 is a circuit diagram of the sub-word driver SWD.

In FIG. 8, four sub-word drivers SWD 0, 2, 4, 6 for driving the sub-word lines SWL0, 2, 4, 6, respectively, are shown. Each sub-word driver SWD is configured by a p-channel MOS transistor P10, and n-channel MOS transistors N10, N11. The gate electrode in FIG. 8 is illustrated with a thick line to indicate that the relevant transistor is a transistor having a higher withstanding voltage than a normal transistor that uses the internal potential VPERI for the power supply. Assuming the threshold value voltage of the transistors N10, N11 is Vt, $$Vt > VSS - VKK$$

Here, VKK is the de-active level of the sub-word line SWL, and is a negative potential smaller than the ground potential VSS.

Description will be made focusing on the sub-word driver SWD0, where the drains of the transistors P10, N10. N11 are all connected to the sub-word line SWL0. The corresponding word driver selecting line FXT0 is connected to the source of the transistor P10, the corresponding main word line MWL0 is connected to the gate electrodes of the transistors P10, N10, and the corresponding word driver selecting line FXB0 is connected to the gate electrode of the transistor N11. The negative potential VKK (<VSS) is supplied to the sources of the transistors N10, N11.

According to such configuration, when the main word line MWL0 and the word driver selecting line FXB0 are driven to the low level (VSS), and the word driver selecting line FXT0 is driven to the high level (VPP), the transistor P10 is turned ON and the transistors N10, N11 are turned OFF so that the sub-word line SWL0 is activated to the VPP level. Thus, the cell transistor Tr (see FIG. 5) connected to the sub-word line SWL0 is turned ON and the cell capacitor C is connected to the corresponding bit line BLT or BLB. In this case, a voltage of VSS−VKK is generated between the gate and the source of the transistor N11 but is smaller than the threshold value voltage Vt, and hence the transistors N10, N11 are correctly maintained in the OFF state.

On the contrary, when the main word line MWL0 is high level (VPP) or when the word driver selecting line FXT0 is low level (VSS) and the word driver selecting line FXB0 is high level (VPP), the sub-word line SWL0 is de-activated to the VKK level. In this case, the cell transistor Tr connected to the sub-word line SWL0 is maintained in the OFF state, whereby the charges held in the cell capacitor C are maintained as is.

Figure 9:
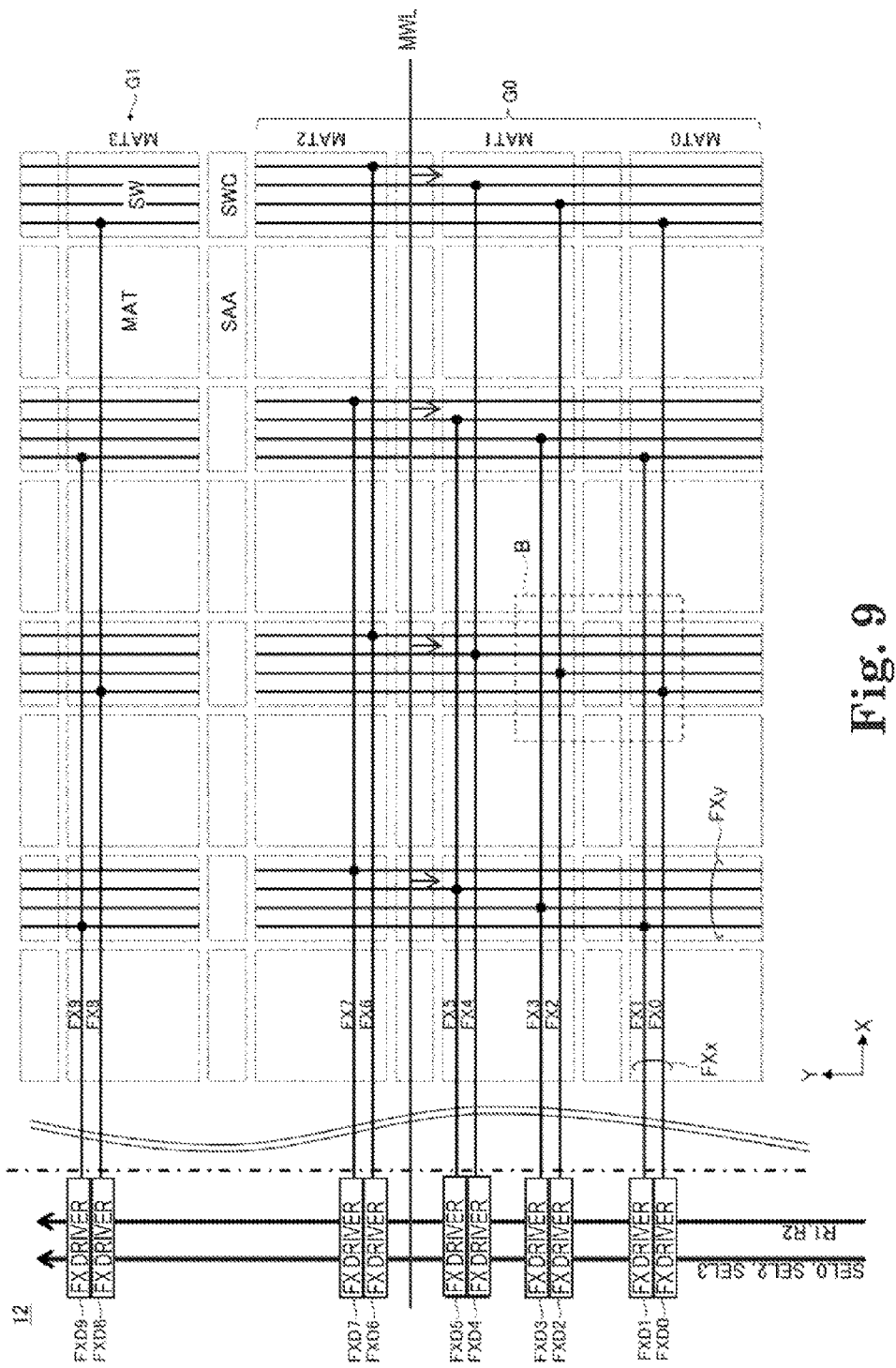
FIG. 9 is a substantially plan view describing a layout of the word driver selecting line at a portion corresponding to a plurality of memory mats.
Figure 10:
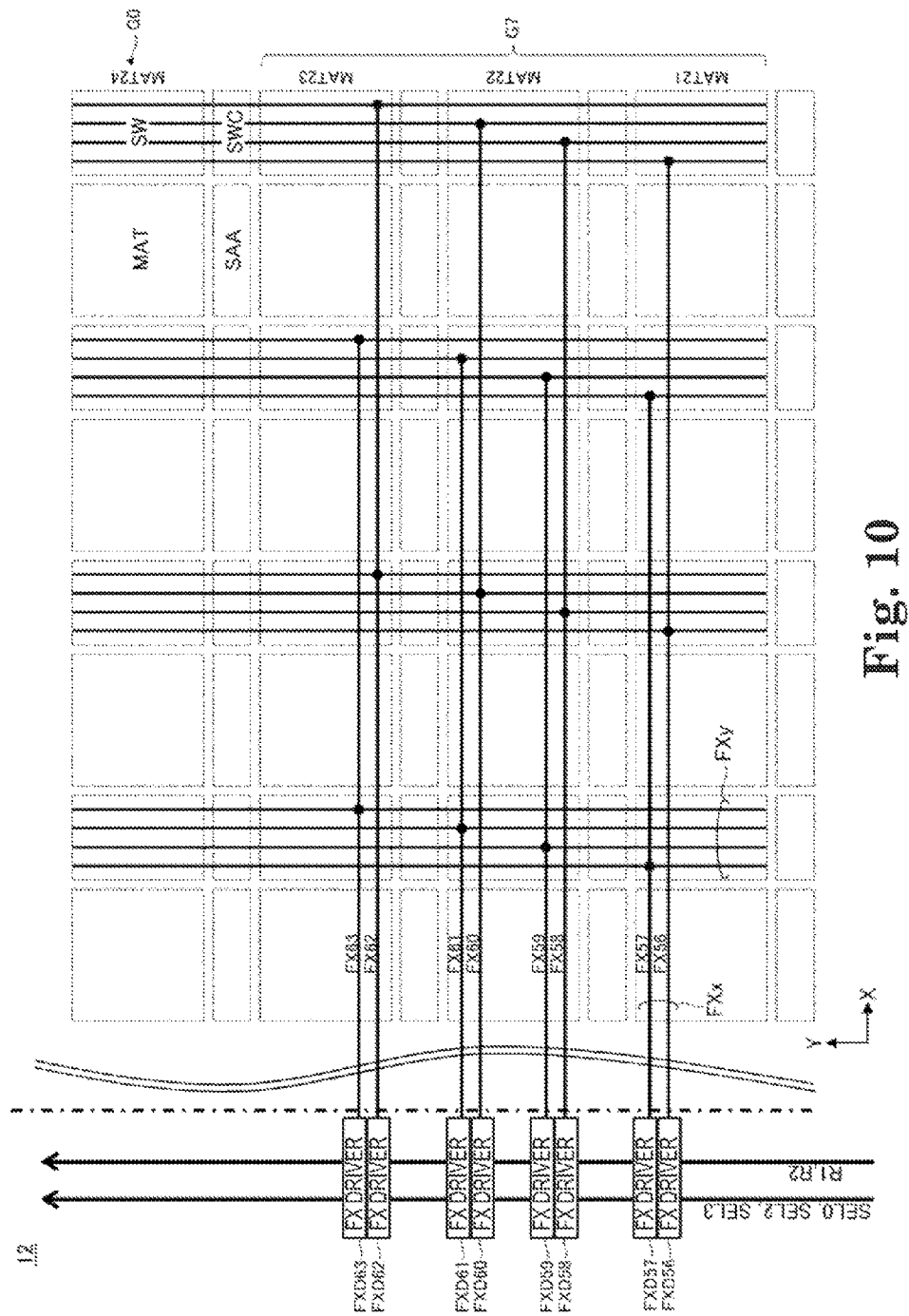
FIG. 10 is a substantially plan view describing a layout of the word driver selecting line at a portion corresponding to a plurality or memory mats.

FIG. 9 and FIG. 10 are substantially plan views describing the layout of the word driver selecting line FX in the first embodiment, where FIG. 9 shows a layout of the portion corresponding to the memory mats MAT0 to MAT3, and FIG. 10 shows a layout of the portion corresponding to the memory mats MAT21 to MAT24. As described above, the word driver selecting line FX is a complementary signal, and hence each of the word driver selecting lines FX (FX0 to FX9, FX56 to FX63) shown in FIG. 9 and FIG. 10 actually includes a pair (two) of wirings. This is similar in FIG. 15 and FIG. 27, to be descried later.

As shown in FIG. 9, eight pairs of word driver selecting lines FX0 to FX7 are assigned to the memory mats MAT0 to MAT2 configuring the group G0. The word driver selecting lines FX0 to FX7 are wirings driven by the FX drivers FXD0 to FXD7 arranged in the row decoder 12, and all include a portion FXx extending in the X direction and a portion FXy extending in the Y direction. The portion FXx extending in the X direction is connected to the corresponding FX driver FXD0 to FXD7, and is arranged on the memory mat MAT and the sub-word driver region SW. The portion FXy extending in the Y direction is alternately arranged by four pairs on the sub-word driver region SW and the sub-word cross region SWC. The portion FXy extending in the Y direction is commonly assigned to the memory mats MAT0 to MAT2 configuring the group G0. Thus, each word driver selecting line FX0 to FX7 is commonly assigned to three memory mats (MAT0 to MAT2) arrayed continuously in the Y direction.

The layout of the word driver selecting line FX in other groups G1 to G7 is basically the same as the layout shown in FIG. 9. As shown in FIG. 10, the memory mat MAT24 included in the group G0 is adjacent to the group G7, and the layout of the word driver selecting lines FX56 to FX63 corresponding to the group G7 is slightly different from the layout shown in FIG. 9 to carry out the selection of the memory mat MAT24. The portion FXy extending in the Y direction of the word driver selecting lines FX56 to FX63 is extended to the sub-word driver region SW corresponding to the memory mat MAT24, so that each word driver selecting line FX56 to FX63 is commonly assigned with respect to the four memory mats (MAT21 to MAT24) arrayed continuously in the Y as shown in FIG. 10.

Figure 11:
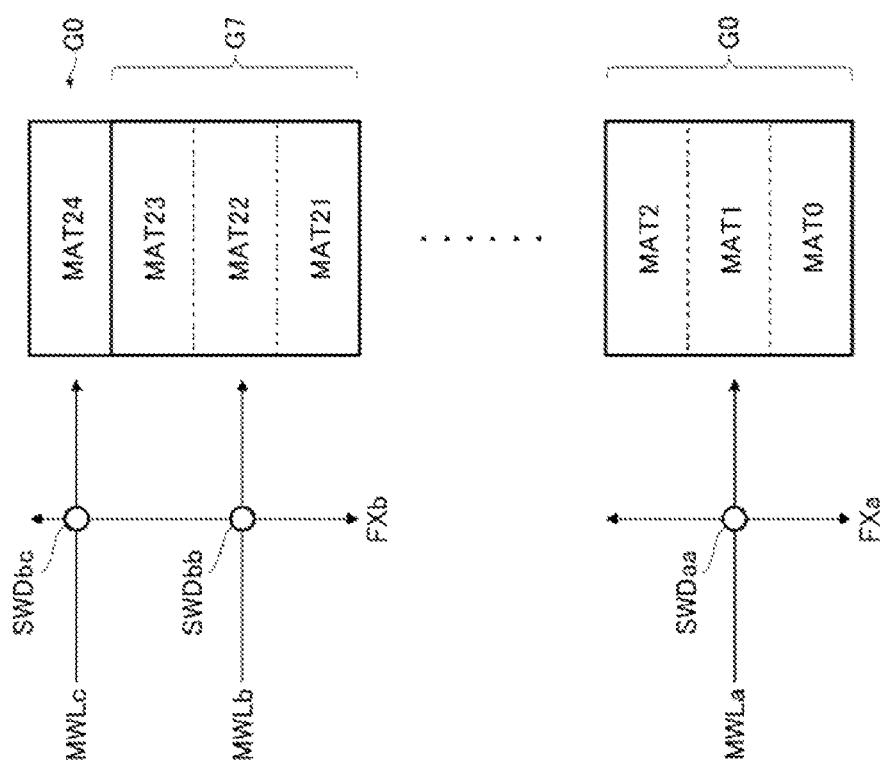
FIG. 11 is a schematic view describing a relationship of groups of memory mats according to an embodiment of the invention.

FIG. 11 is a schematic view describing the relationship of the group G0 and the group G7 in a more simplified manner.

In FIG. 11, three main word lines MWLa to MWLc and two pairs of driver selecting lines FXa, Fxb are shown. Among such lines, the main word line MWLa is assigned to one of the memory mats MAT0 to MAT2, the main word line MWLb is assigned to one of the memory mats MAT21 to MAT23, and the main word line MWLc is assigned to the memory mat MAT24. The driver selecting line FXa corresponds to one of the driver selecting lines FX0 to FX7 shown in FIG. 9, and is commonly assigned to the memory mats MAT0 to MAT2. Furthermore, the driver selecting line FXb corresponds to one of the driver selecting lines FX56 to FX63 shown in FIG. 10, and is commonly assigned to the memory mats MAT21 to MAT24.

When the main word line MWLa and the driver selecting line FXa are selected, the sub-word driver SWDaa corresponding to such lines is activated, and the sub-word line SWL included in one of the memory mats MAT0 to MAT2 is driven. When the main word line MWLh and the driver selecting line FXb are selected, the sub-word driver SWDbb corresponding to such lines is activated, and the sub-word line SWL included in one of the memory mats MAT21 to MAT23 is driven. Furthermore, when the main word line MWLc and the driver selecting line FXb are selected, the sub-word driver SWDbc corresponding to such lines is activated, and the sub-word line SWL included in the memory mat MAT24 is driven.

Thus, although the memory mat MAT24 belongs to the group G0, the driver selecting line FXb corresponding to the group G7 is assigned instead of the driver selecting line FXa corresponding to the group G0 with respect to the memory mat MAT24. The main word line MWLc assigned to the memory mat MAT24, however, is activated when the memory mat MAT0 is selected by the selecting signal SEL2, and hence the memory mat MAT24 can be handled as the group G0.

Figure 12:
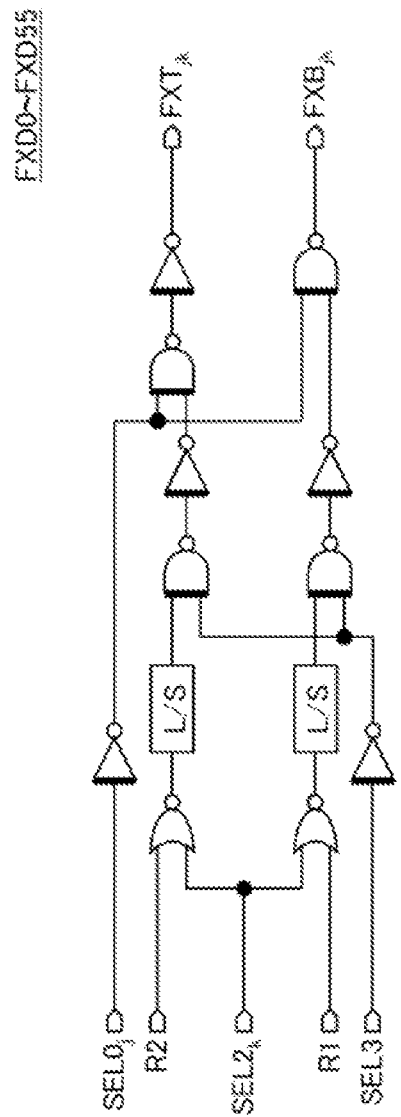
FIG. 12 is a circuit diagram of a driver according to an embodiment of the invention.
Figure 13:
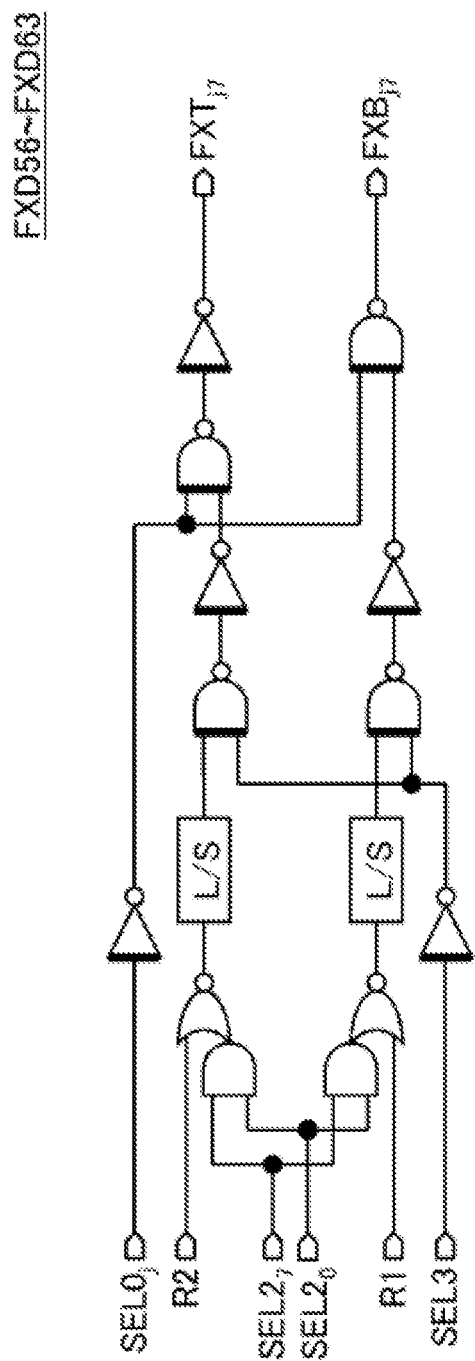
FIG. 13 is a circuit diagram of a driver according to an embodiment of die invention.

FIG. 12 is a circuit diagram of the FX drivers FXD0 to FXD55 and FIG. 13 is a circuit diagram of the FX drivers FXD56 to FXD63, where both figures show an FX driver selected when the selecting signal SEL3 is low level.

As shown in FIG. 12, the FX drivers FXD0 to FXD55 are configured by a plurality of logic gate circuits that receive the selecting signal $SEL0_j$ (j=0~7), a selecting signal $SEL2_k$ (k=0~6), the selecting signal SEL3, and control signals R1, R2. According to the circuit configuration shown in FIG. 12, when the selecting signals $SEL0_j$, $SEL2_k$, SEL3 are activated to the low level, the word driver selecting, signal $FXB_{jk}$ (jk=0 to 55) is activated in a period in which the control signal R1 is low level, and the word driver selecting signal $FXT_{jk}$ is activated in a period, in which the control signal R2 is low level. That is, one of the pair of word driver selecting hues $FX_{jk}$ is activzued by the activation of the selecting signals $SEL0_j$, $SEL2_k$.

As shown in FIG. 13, the FX driver FXD56 to FXD63 are configured by a plurality of logic gate circuits that receive a selecting signal $SEL0_j$ (j=0~7), a selecting signal $SEL2_0$, a selecting signal $SEL2_7$, the selecting signal SEL3, and the control signals R1, R2. According to the circuit configuration shown in FIG. 13, when the selecting signals $SEL0_j$, SEL3 are activated to the low level, the selecting signal $SEL2_0$ or $SEL2_7$ is activated, the word driver selecting signal $FXB_{j7}$ (j7=56~63) is activated in a period in which the control signal R1 is low level, and the word driver selecting signal $FXT_{j7}$ is activated in a period in which the control signal R2 is low level. That is, one of the pair of word driver selecting lines $FX_{j7}$ corresponding to the selecting signal $SEL0_j$ is activated by the activation of the selecting signals $SEL2_0$ or $SEL2_7$.

Figure 14:
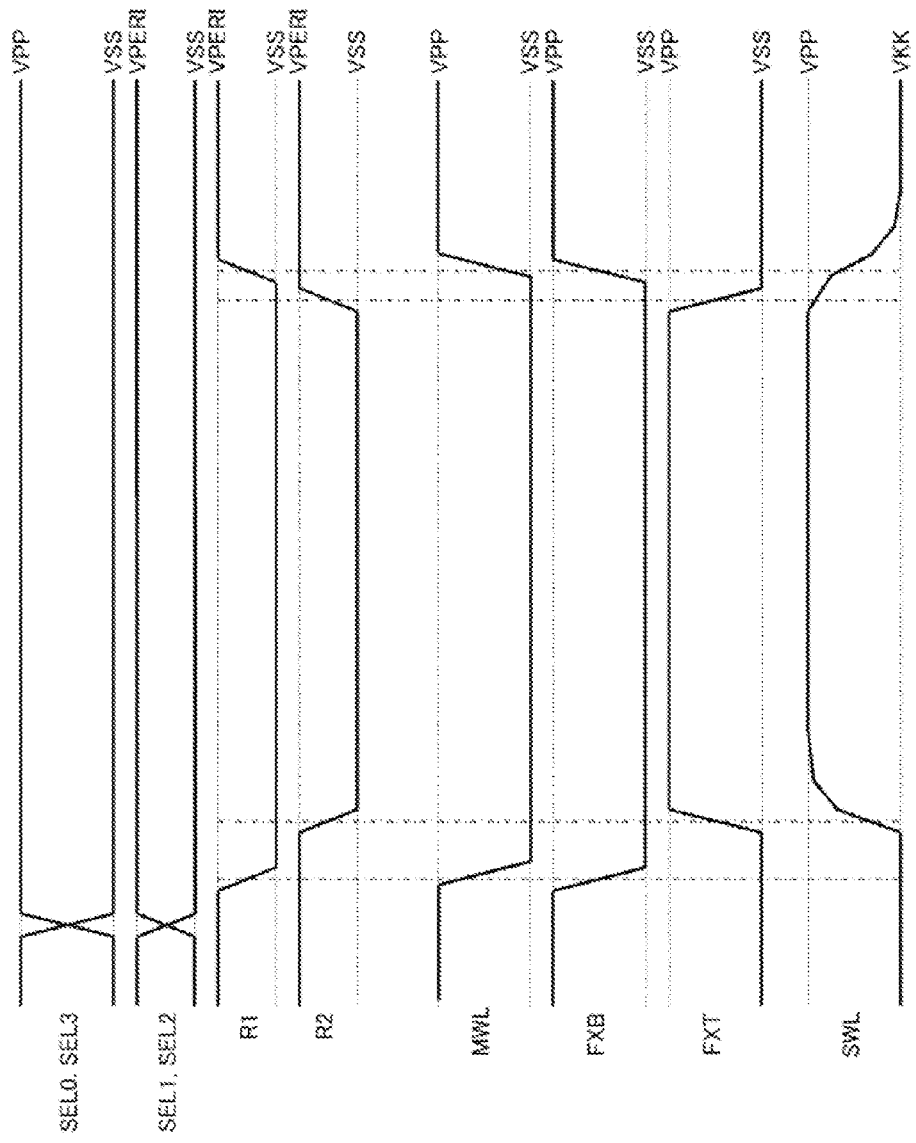
FIG. 14 is a waveform chart describing an operation timing of a driver and a sub-word driver according to an embodiment of the invention.

FIG. 14 is a waveform chart describing an operation timing of the FX driver FXD and the sub-word driver SWD.

As shown in FIG. 14, when a predetermined word driver selecting signal FXT, FXB and a predetermined main word line MWL are activated, the sub-word driver SWD selected thereby drives the corresponding sub-word line SWL to the VPP level. The amplitude necessary for the word driver selecting signals FXT, FXB is from VSS to VPP (>VPERI), whereas the amplitude of the selecting signals SEL1, SEL2 and the control signals R1, R2 is from VSS to VPERI. Thus, as shown in FIG. 12 and FIG. 13, a level shift circuit L/S for converting the amplitude is inserted to the signal path of the selecting signals SEL1, SEL2 and the control signals R1, R2. In FIG. 12 and FIG. 13, a part of a symbol mark of the logic circuit is displayed in bold type to indicate that the logic circuit is configured by a transistor of high withstanding voltage.

As described above, the FX driver FXD according to the present embodiment does not use the selecting signal SEL1. This is because the extending range of the driver selecting line FX basically corresponds to each group G0 to G7, and the information associated with which memory mat MAT in the group is selected, that is, the selecting signal SEL1 is unnecessary. The circuit configuration of the FX driver FXD is thus simplified, whereby the occupying area of the FX driver in the memory cell array 11 can be reduced.

Figure 15:
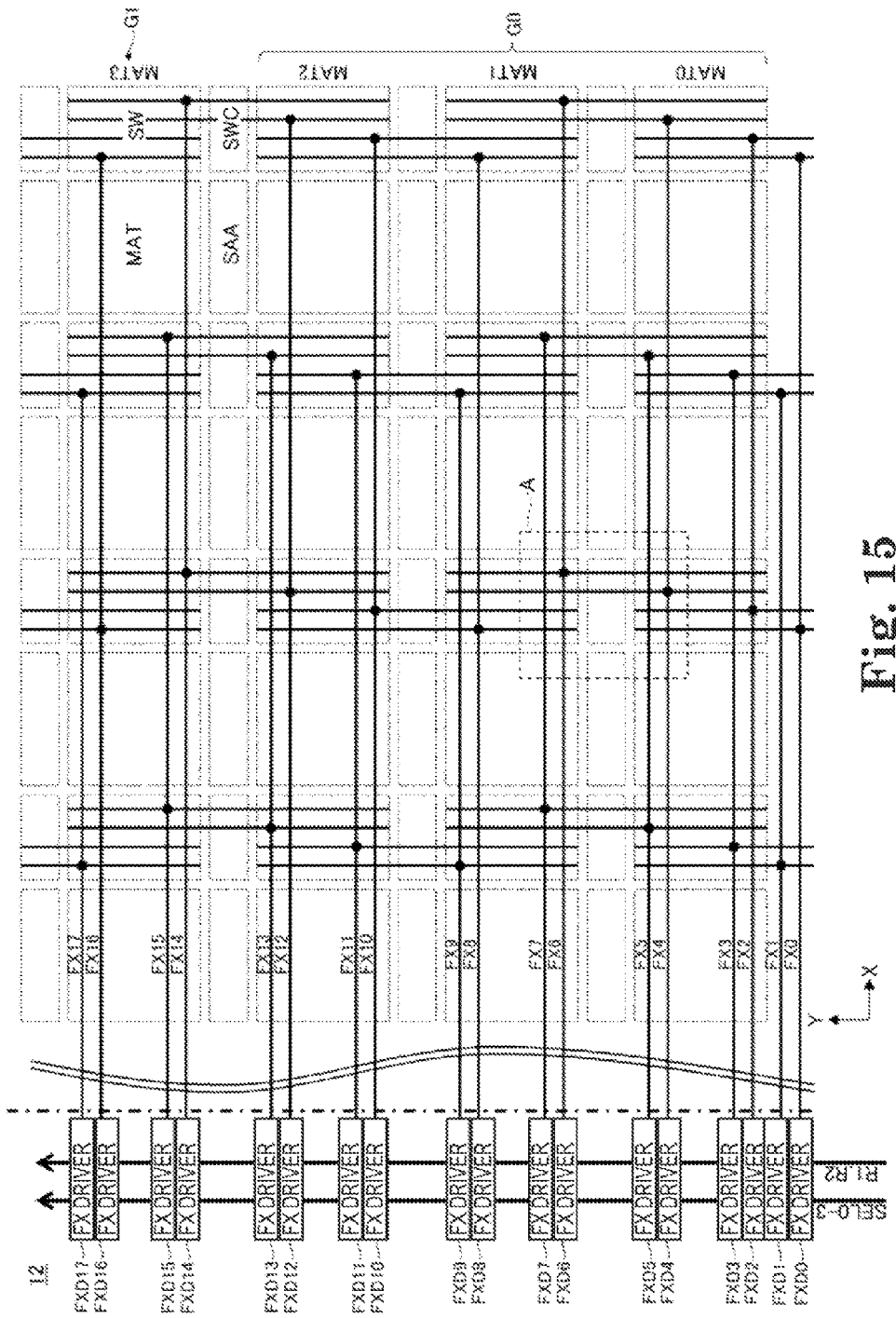
FIG. 15 is a substantially plan view describing a layout of the word driver selecting line.

FIG. 15 is a substantially plan view describing a prototype layout of a word driver selecting line FX considered by the inventor of the present invention in the course of contriving the present invention, and shows the layout of a portion corresponding to the memory mats MAT0 to MAT3.

The prototype layout shown in FIG. 15 differs from the layout of the present embodiment shown in FIG. 9 and FIG. 10, and has a configuration in which the same driver selecting, line FX is shared between the two memory mats MAT adjacent in the Y direction. The four pairs of driver selecting signals FX pass in the X direction on one memory mat MATi (i=0 to 24), where the two of the four pairs of driver selecting signals FX are shared between two memory mats MATi, MATi−1, and the remaining two pairs of driver selecting signals FX are shared between two memory mats MATi, MATi+1.

Figure 16:
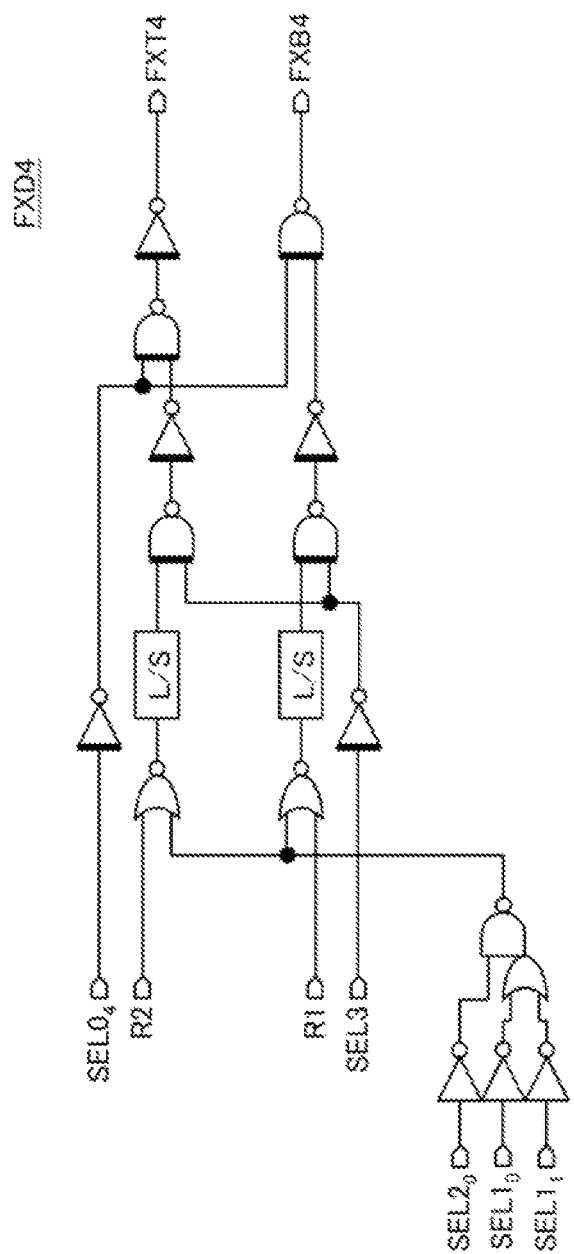
FIG. 16 is a circuit diagram or a driver.
Figure 17:
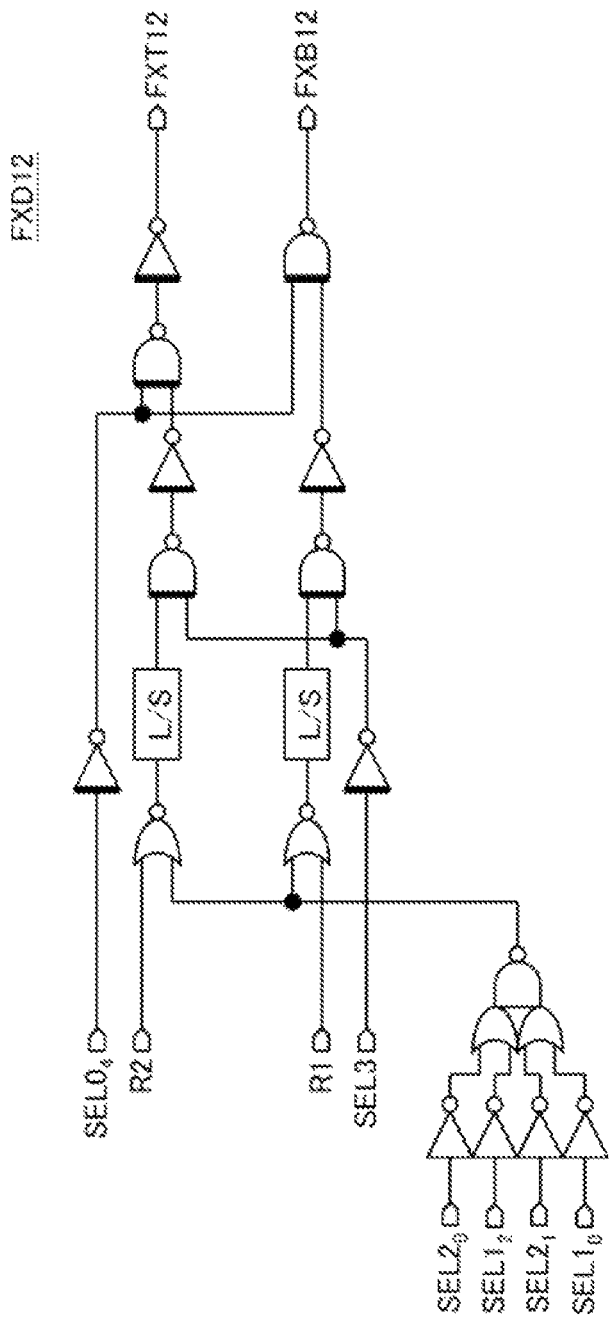
FIG. 17 is a circuit diagram of a driver.

FIG. 16 is as circuit diagram of a prototype FX driver FXD4, and FIG. 17 is a circuit diagram of a prototype FX driver FXD 12, where both figures shown the FX driver selected when the selecting signal SEL3 is low level.

As shown in FIG. 16, the prototype FX driver FXD4 is configured by a plurality of logic gate circuits that receive the selecting signals $SEL0_4$, $SEL1_0$, $SEL1_1$, $SEL2_0$, SEL3, and the control signals R1, R2. According to the circuit configuration shown in FIG. 16, when the selecting signals $SEL0_4$, $SEL2_0$, SEL3 are activated to low level and the selecting signal $SEL1_0$ or the selecting signal $SEL1_1$ is activated to low level, the word driver selecting signals FXT4, FXB4 are activated. The selecting signals $SEL1_0$, $SEL1_1$ need to be used because the sharing range of the word driver selecting signal FX does not correspond to a group, and information on which memory mat MAT to select in the selected group (group G0 in the example shown in FIG. 16) is required.

As shown in FIG. 17, the prototype FX driver FXD12 is configured by a plurality of logic gate circuits that receive the selecting signals $SEL0_4$, $SEL1_0$, $SEL1_2$, $SEL2_0$, $SEL2_1$, SEL3 and the control signals R1, R2. According to the circuit configuration shown in FIG. 17, when the selecting signals $SEL0_4$, SEL3 are activated to low level, and the selecting signal $SEL1_0$ or the selecting signal $SEL1_2$ is activated to low level, and furthermore, when the selecting signal $SEL2_0$ or the selecting signal $SEL2_1$ is activated to low level, the word driver selecting signals FXT12, FXB12 are activated. The selecting signals $SEL1_0$, $SEL1_2$ need to be used for reasons described above, and the selecting signals $SEL2_0$, $SEL2_1$ need to be used because some driver selecting signals FX (e.g., FX12) are shared between two memory mats MAT (memory mats MAT2, MAT3 in the example shown in FIG. 17) belonging to different groups (group G0 and group G1 in the example shown in FIG. 17).

Thus, when the prototype layout is used, a need to input the selecting signal SEL1 to the FX driver FXD arises, and hence the circuit scale of the FX driver FXD increases. Furthermore, when the prototype layout is used, 104 FX drivers FXD are required for each memory mat group positioned on both sides of the row decoder 12, and hence the occupying area of the FX driver in the memory cell array 11 increases. On the contrary, when the layout according to the present embodiment described above is used, use of 64 FX drivers FXD for each memory mat group positioned on both sides of the row decoder 12 is sufficient, and thus the occupying area of the FX driver in the memory cell array 11 can be greatly reduced compared to when the prototype layout is used.

Figure 18:
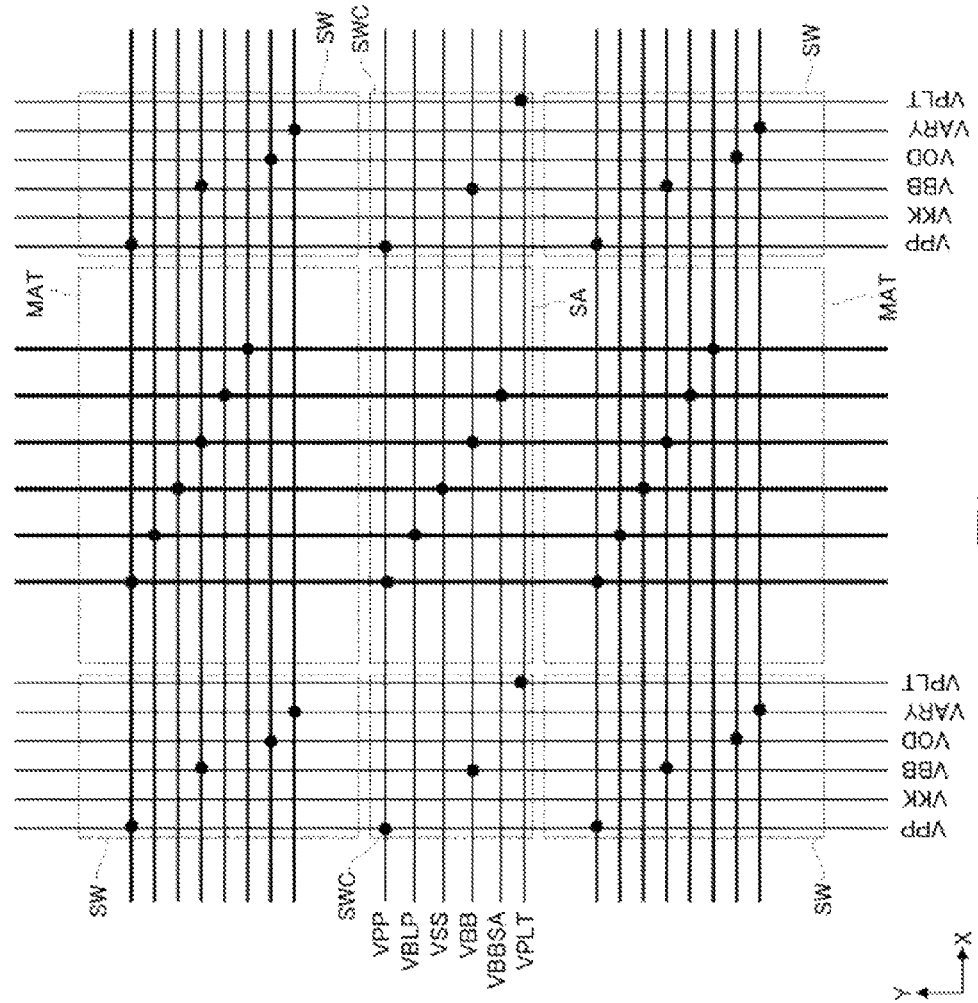
FIG. 18 is a schematic view showing one example or a power supply wiring arranged at an upper part of the memory cell array according to an embodiment of the invention.

FIG. 18 is a schematic view showing one example of a power supply wiring arranged at an upper part of the memory cell array 11.

As shown in FIG. 18, a plurality of power supply wirings extending in the X direction and the Y direction are arranged at the upper part, of the memory cell array 11, where the upper and lower power supply wirings are connected at the corresponding intersection to build the power supply wirings in a mesh form. In the example shown in FIG. 18, the power supply wirings for supplying the power supply potentials VPP, VKK, VBB, VOD, VARY, VPLT, VBLP, VSS, VBBSA are shown. Such power supply wirings are arranged to fill the vacant region where the signal wiring is not formed, and hence a greater number of power supply wirings can be arranged the lesser the number of necessary signal wirings and the potential can be more stabilized.

Figure 19:
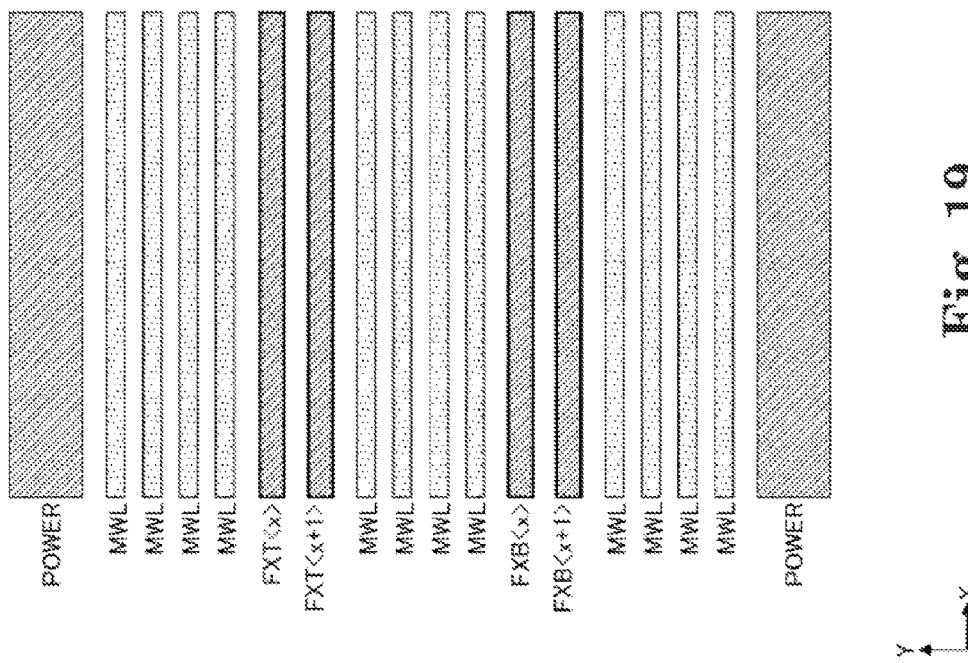
FIG. 19 is a substantially plan view showing a part of the wiring layer, where the main word line and the driver selecting line are formed.
Figure 20:
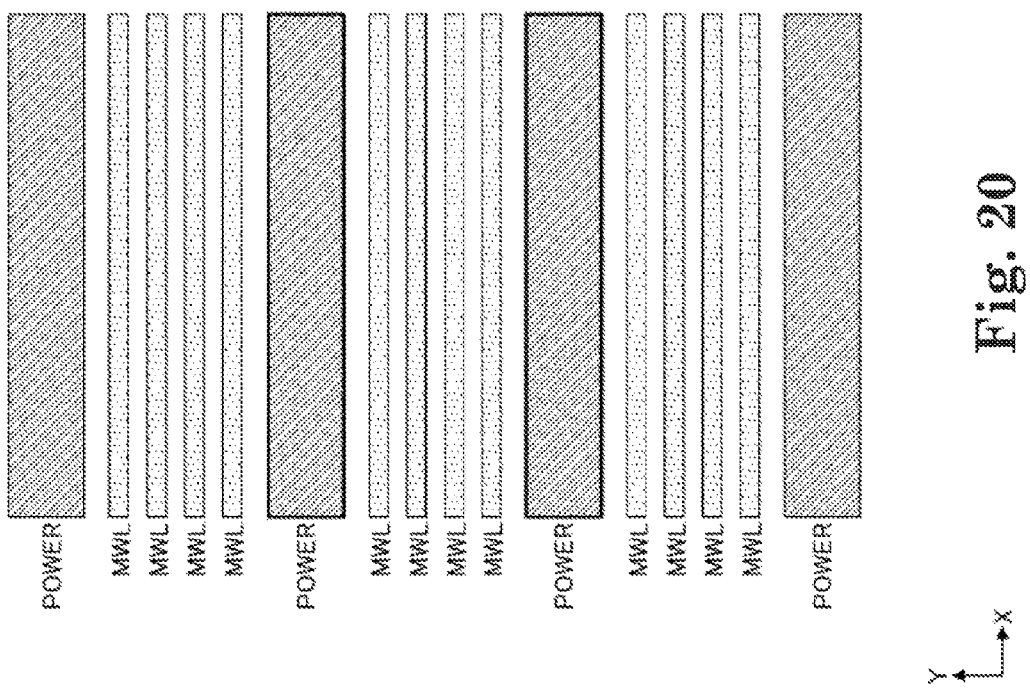
FIG. 20 is a substantially plan view showing a part of the wiring layer, where the main word line and the driver selecting line are formed, and shows an example according to the first embodiment.

FIG. 19 and FIG. 20 are substantially plan views showing a part of the wiring layer, where the main word line MWL and the driver selecting line FX are formed, of the wiring layers arranged at the upper part of the memory mat MAT, where FIG. 19 shows a prototype example shown in FIG. 15, and FIG. 20 shows an example according to the first embodiment.

As shown in FIG. 19, a plurality of main word lines MWL and driver selecting lines FX extending in the X direction are formed in the relevant wiring layer. A power supply wiring POWER is arranged to fill the vacant region where the main word lines MWL and the driver selecting lines FX are not arranged. The power supply wiring POWER is an arbitrary power supply wiring extending in the X direction of the power supply wirings shown in FIG. 18. In the prototype example shown in FIG. 19, the region that can be assigned to the power supply wiring POWER is reduced since the number of driver selecting lines FX is large. FIG. 19 shows four driver selecting lines FXT<x>, FX<x+1>, FXB<x>, FXB<x+1>.

On the contrary, as shown in FIG. 20, in the example according to the first embodiment, the number of driver selecting lines FX is reduced compared to the prototype example. Specifically, as a result of the driver selecting lines FXT<x>, FXB<x>, FXB<x+1> shown in FIG. 19 becoming unnecessary, the power supply wiring POWER is arranged in the relevant region. Thus, more regions can be assigned to the power supply wiring POWER in the present embodiment, whereby the potential of the power supply wiring can be more stabilized.

Figure 21:
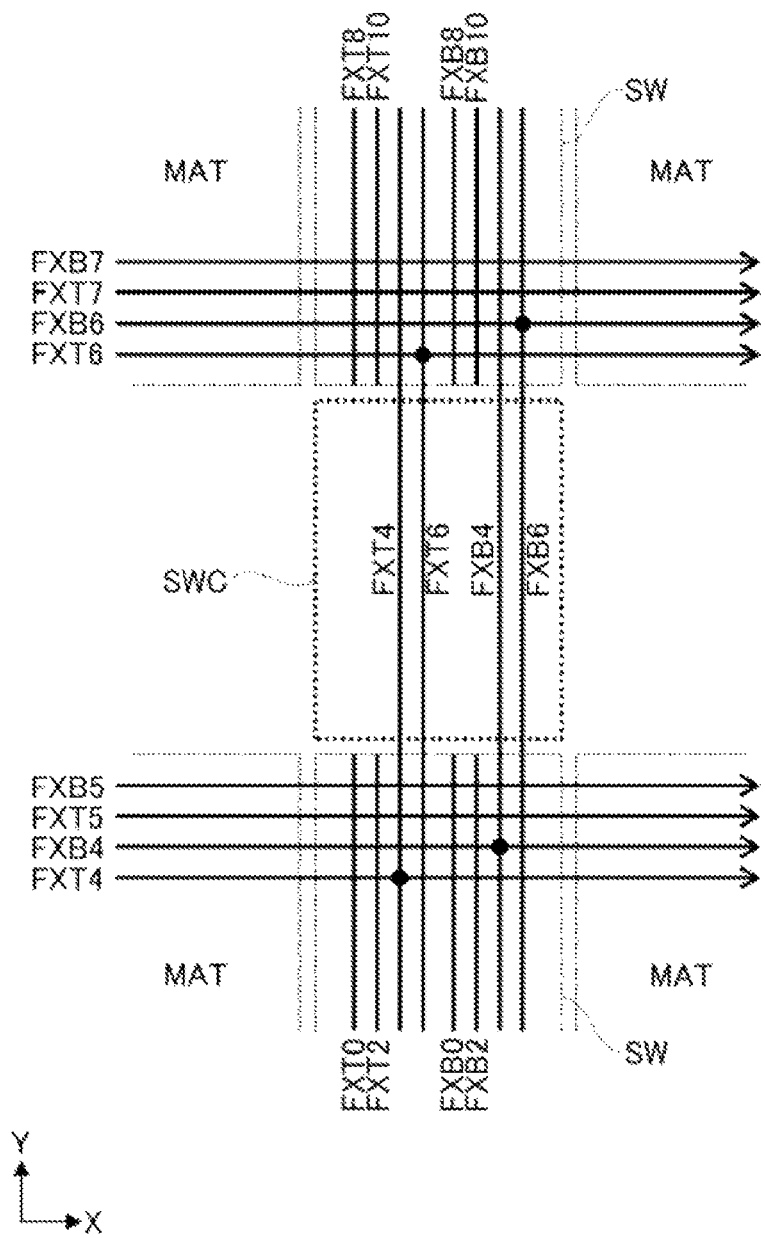
FIG. 21 is an enlarged view of a region A shown in FIG. 15.
Figure 22:
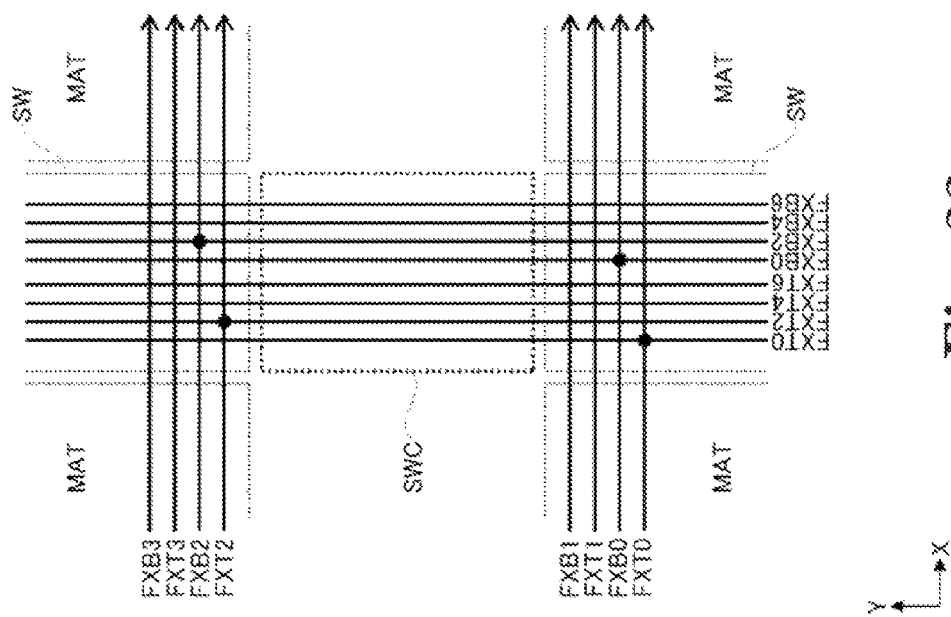
FIG. 22 is an enlarged view of a region B shown in FIG. 9.

FIG. 21 is an enlarged view of a region A shown in FIG. 15, and FIG. 22 is an enlarged view of a region 13 shown in FIG. 9.

As shown in FIG. 21, in the prototype layout, four (two pairs of) driver selecting lines FX pass in the Y direction on the sub-word cross region SWC. As shown in FIG. 22, on the other hand, eight (four pairs of) driver selecting lines FX pass in the Y direction on the sub-word cross region SWC in the layout according to the present embodiment. Thus, the wiring density on the sub-word cross region SWC becomes slightly high compared to the prototype layout. If this becomes a problem, it is effective to reduce the type of power supply potentials used in the sub-word cross region SWC.

Figure 23:
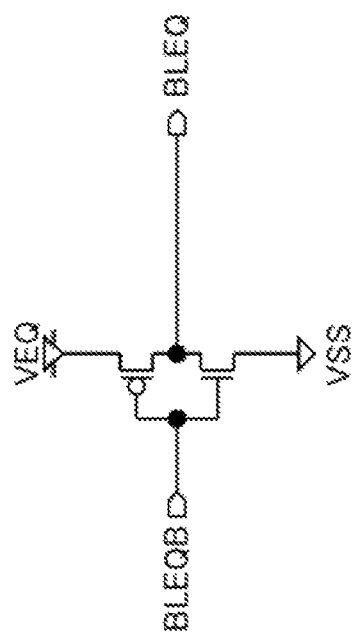
FIG. 23 is a circuit diagram of a typical equalize driver.

For example, an equalize driver EQD shown in FIG. 23 is arranged in the sub-word cross region SWC. The equalize driver EQD is a circuit that generates a bit line equalize signal BLEQ for controlling the equalize circuit EQ shown in FIG. 6, and an equalize dedicated potential VEQ higher than the array potential is used for the operation potential thereof. Since a sense amplifier driver including the transistors 42, 43 shown in FIG. 6 is also arranged in the sub-word cross region SWC, wirings that provide the potentials VOD, VARY, VEQ are arranged in the relevant region SWC.

Figure 24:
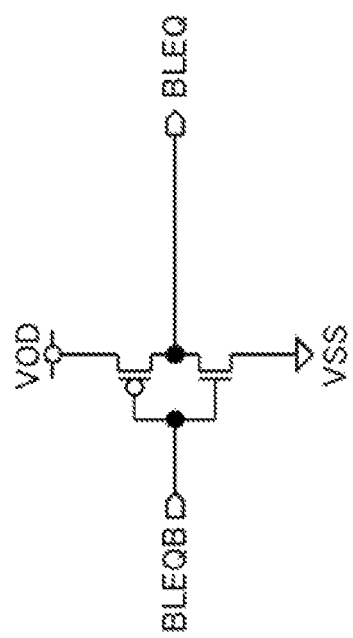
FIG. 24 is a circuit diagram of an improved equalize driver.

If the use of the layout according to the present embodiment leads to lacking of the wiring region on the sub-word cross region SWC, the over drive potential VOD may be used instead of the equalize dedicated potential VEQ as the operation potential used in the equalize driver EQD, as shown in FIG. 24. The need to provide the equalize dedicated potential VEQ to the sub-word cross region SWC is thus eliminated, whereby the wiring density on the sub-word cross region SWC is alleviated and eight (four pairs of) driver selecting lines FX can be passed on the sub-word cross region SWC as shown in FIG. 22. The over drive potential VOID is a potential higher than the array potential VARY, and hence substantially the same properties as when the equalize dedicated potential VEQ is used can be obtained.

As described above, according to the semiconductor device by the present embodiment, the occupying area of the FX driver in the memory cell array 11 can be reduced. Thus, the chip area can be further reduced compared to the prior art.

A second embodiment of the present invention will now be described.

Figure 25:
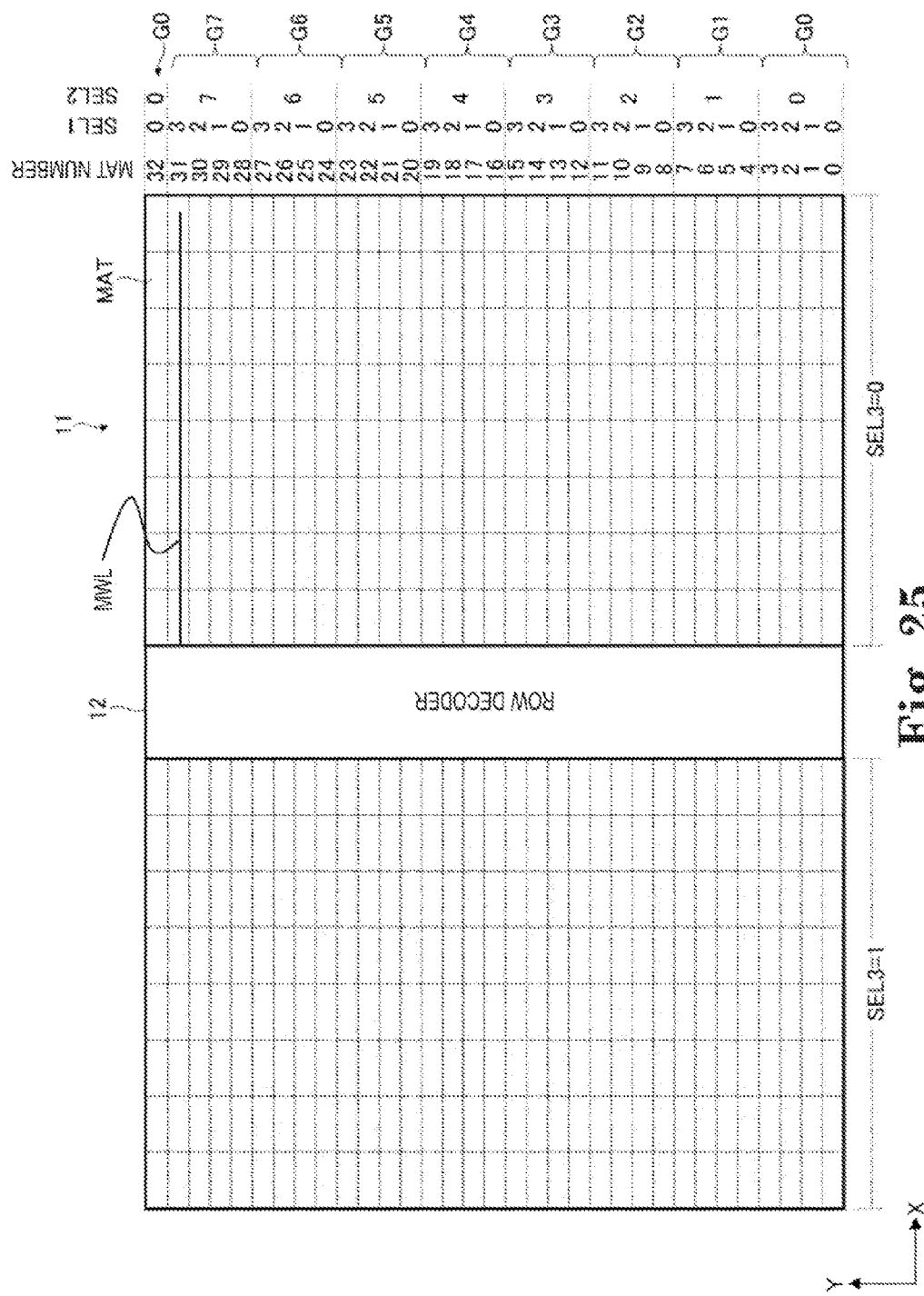
FIG. 25 is a schematic plan view describing a configuration of a memory cell array according to a second embodiment.

FIG. 25 is a schematic plan view describing a configuration of a memory cell array according to the second embodiment.

As shown in FIG. 25, the memory cell array 11 according to the present embodiment differs from the first embodiment described above in that 16 memory mats MAT in the X direction and 33 memory mats MAT in the Y direction are laid out in a matrix form. Assuming the 33 memory mats arrayed in the Y direction are MAT0 to MAT32, the 33 memory mats are grouped into eight groups. Among such groups, the group G0 includes five memory mats MAT0 to MAT3, MAT32, and each of the other groups G1 to G7 are configured by four memory mats (e.g., MAT4 to MAT7). Only the group G0 is configured by five memory mats because the memory cell array 11 has an open bit line type layout, similar to the first embodiment.

In the present embodiment as well, one of the groups G0 to G7 is selected or segmented by the selecting signal SEL2. The selecting signal SEL2 is a signal (SEL2$_0$ to SEL2$_7$) of eight bits, where each bit corresponds to each of the groups G0 to G7.

Which memory mat to select from the selected group G0 to G7 is specified by the selecting signal SEL1. The selecting signal SEL1 is a signal (SEL1$_0$ to SEL1$_3$) of four bits, where each bit corresponds to the four memory mats in the group. The memory mats MAT0, MAT32 positioned at the ends are both assigned with the selecting signal SEL1$_0$, so that the memory mats MAT0, MAT32 are simultaneously selected.

Figure 26:
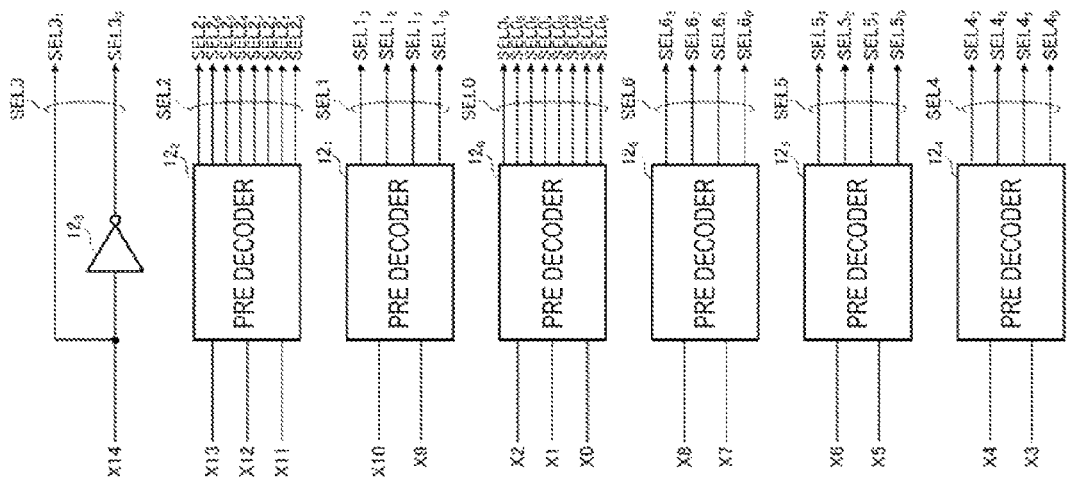
FIG. 26 is a block diagram showing a pre-decoder arranged in the row decoder according to an embodiment of the invention.

FIG. 26 is a block diagram showing a pre-decoder arranged in the row decoder 12.

As shown in FIG. 26, the row decoder 12 used in the present embodiment differs from the first embodiment in the configuration of the pre-decoders 12$_1$, 12$_4$ to 12$_6$. That is, the pre-decoder 12$_1$ receives the bits X9, X10 of the row address and decodes such, bits to activate any one bit of the signals SEL1$_0$ to SEL1$_3$ of four bits configuring the selecting signal SEL1. In the present embodiment, the number of memory mats included in one group is four, which is a number that can be expressed with power of two, and hence the configuration of the pre-decoder 12$_1$ can be greatly simplified compared to the first embodiment.

Furthermore, the pre-decoder 12$_4$ receives the bits X3, X4 of the row address and decodes such bits to activate any one bit of the signals of four bits configuring the selecting signal SEL4. The pre-decoder 12$_5$ receives the bits X5, X6 of the row address and decodes such bits to activate any one bit of the signals of four bits configuring the selecting signal SEL5. The pre-decoder 12$_6$ receives the bits X7, X8 of the row address and decodes such bits to activate any one bit of the signals of four bits configuring the selecting signal SEL6.

Figure 27:
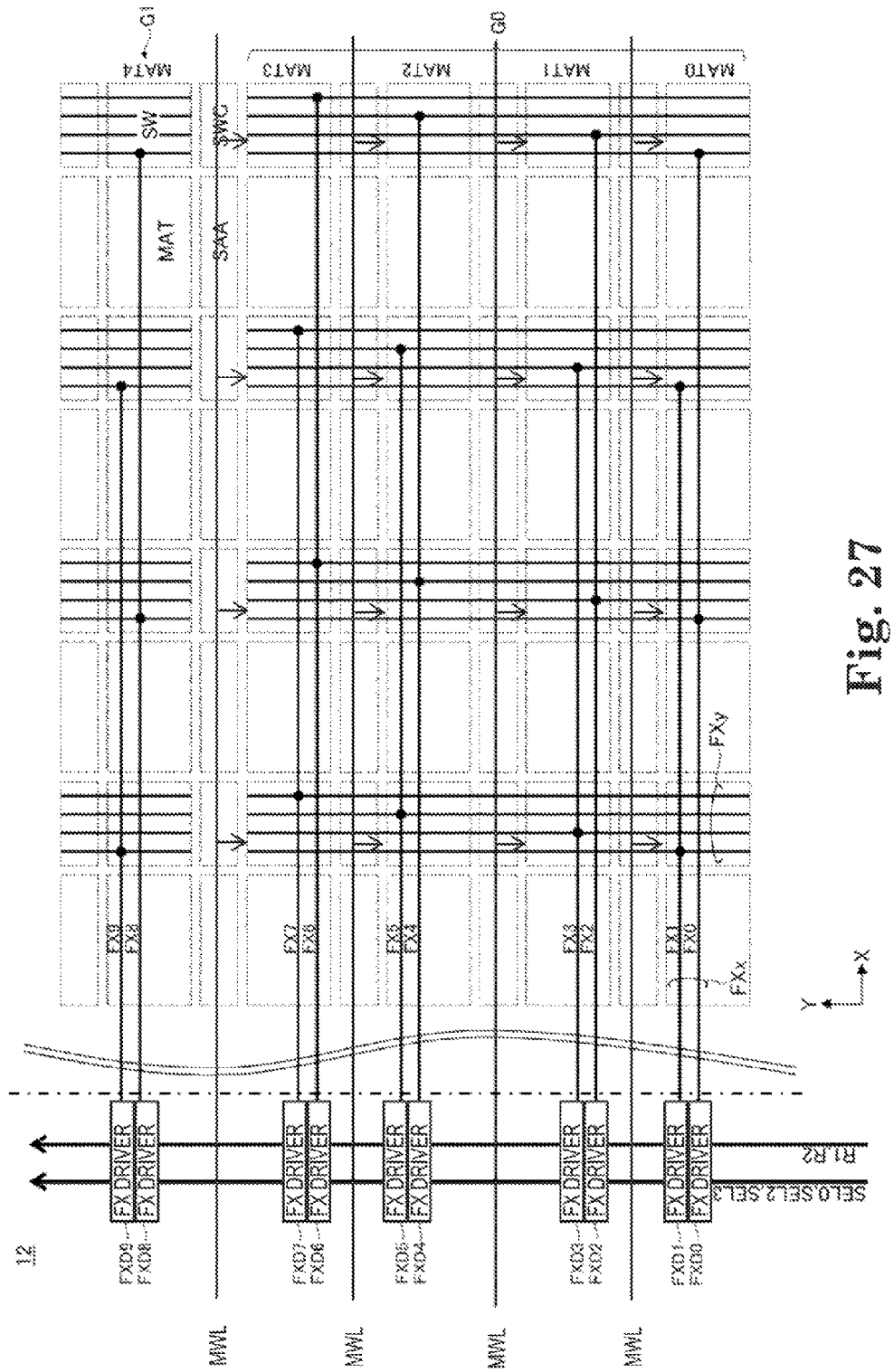
FIG. 27 is a substantially plan view describing a layout of the word driver selecting line according to the second embodiment, and shows a layout of a portion corresponding to a plurality of memory mats.

FIG. 27 is a substantially plan view describing a layout of the word driver selecting line FX according to the second embodiment, and shows a layout of a portion corresponding to the memory mats MAT0 to MAT4.

As shown in FIG. 27, eight pairs of word driver selecting lines FX0 to FX7 are assigned to the memory mats MAT0 to MAT3 configuring the group G0. The group includes 2048 sub ward lines for example. In this case, each of the memory mats MAT0 to MAT3 includes 512 ($2^9$) sub word lines. The word driver selecting lines FX0 to FX7 are wirings driven by the FX drivers FXD0 to FXD7, arranged in the row decoder 12, and all include a portion FXx extending in the X direction and a portion FXy extending in the Y direction. The portion FXx extending in the X direction is connected to the corresponding FX driver FXD0 to FXD7, and is arranged on the memory mat MAT and the sub-word driver region SW. The portion FXy extending in the Y direction is alternately arranged by four pairs on the sub-word driver region SW and the sub-word cross region SWC. The portion FXy extending in the direction is commonly assigned to the memory mats MAT0 to MAT3 configuring the group G0. Thus, each word driver selecting line FX0 to FX7 is commonly assigned to four memory mats (MAT0 to MAT3) arrayed continuously in the Y direction. It is noted four main word lines extend in the Y direction over the respective sub-word driver regions SW as shown in FIG. 7. Moreover, each of the word driver selecting lines fX0 to FX7 segment the memory mats arranged on the same vertical line into a group of memory mats including the four mats (MAT0 to MAT3). This structure is repeated until MAT32.

The layout of the word driver selecting line FX in other groups G1 to G7 is basically the same as the layout shown in FIG. 27. Although not shown, the memory mat MAT32 included in the group G0 is adjacent to the group G7, and the layout of the word driver selecting, lines FX56 to FX63 corresponding to the group G7 slightly different from the layout shown in FIG. 27 to carry out the selection of the memory mat MAT32. This aspect is described using FIG. 10, and thus redundant description will be omitted.

In the present embodiment as well, the selecting signal SEL1 does not need to be input to the FX driver FXD since the word driver selecting line FX is arranged for each group. Similar to the first embodiment, therefore, the circuit configuration of the FX driver FXD is simplified, and hence the occupying area of the FX driver in the memory cell array 11 can be reduced.

If the prototype layout shown in FIG. 15 is used when the number of memory mats in the Y direction is 33, 136 FX drivers FXD are required, and thus the number of FX drivers FXD is greatly increased. In the present embodiment, on the other hand, the number of FX drivers can be suppressed to 64, similar to the first embodiment, although the number of memory mats is increased to 33. Therefore, the number of driver selecting lines FX can be reduced compared to the prototype example, and more regions can be assigned to the power supply wiring POWER by such amount, whereby the potential can be more stabilized.

The preferred embodiments of the present invention have been described above, but the present invention is not limited to the embodiments described above, and various changes can be made within a scope not deviating from the gist of the invention. Needless to say, such changes are also encompassed within the scope of the present invention.

For example, iii the embodiments described above, each group G0 to G7 is configured by three or four memory mats MAT, but the present invention is not limited thereto. Therefore, the number of memory mats configuring each group may be, fix example, five or more. The dividing number of the memory cell array 11 is appropriately selected in view of the bit line capacity, and the like, but the number of memory mats configuring one group is preferably three or four. This is because the effect of reducing the FX driver FXD is barely obtained if the number of memory mats configuring one group is two, and the wiring length of the driver selecting line FX extending in the Y direction becomes too long and the operation speed at the time of row access greatly lowers by the wiring load if the number of memory mats configuring one group is greater than four.

Furthermore, in the embodiments described above, the memory mats MAT are grouped into eight groups G0 to G7, but the number of groups is not limited thereto in the present invention.

Moreover, in the embodiments described above, a case in which the present invention is applied to the DRAM has been described, but the application target of the present invention is not limited thereto, and the present invention may be applied to other types of semiconductor memory devices such as flash memory. ReRAM, and the like, or may be provided to a logic semiconductor device including the memory cell array.

What is claimed is:

1. A device comprising:
   a plurality of memory mats arranged on a first line in a first direction; and
   a plurality of word driver selection lines each including a first wiring extending in a second direction perpendicular to the first direction and a second wiring extending on a second line in the first direction, each of the second wirings of the plurality of word driver selection lines being provided to segment the plurality of memory mats into a plurality of groups of the memory mats, each of the plurality of groups of the memory mats including four mats, and each of the plurality of word driver selection lines has access to the plurality of memory mats by the respective four memory mats;
   a plurality of main word lines coupled to access the respective memory mats;
   a first decoder coupled to drive the plurality of main word lines based on a first portion and a second portion of an address signal; and
   a second decoder coupled to drive the plurality of word driver selection lines respectively based on the first portion and a third portion of the address signal, and independent of the second portion of the address signal.

2. The device as claimed in claim 1, wherein the first, second and third portions of the address signal are different from one another.

3. The device as claimed in claim 1, the device further comprising:
   first and second power source wirings extending in the first direction,
   wherein a main word line of the plurality of main word lines extends in the first direction and is sandwiched between the first and second power source wirings.

4. The device as claimed in claim 1,
   wherein each of the second wirings continuously extends over the respective four memory mats.

5. A device comprising:
   a plurality of memory mats arranged on a first line in a first direction; and
   a plurality of word driver selection lines each including a first wiring extending in a second direction perpendicular to the first direction and a second wiring extending on a second line in the first direction, each of the second wirings of the plurality of word driver selection lines being provided to segment the plurality of memory mats into a plurality of groups of the memory mats, each of the plurality of groups of the memory mats including four mats, and each of the plurality of word driver selection lines has access to the plurality of memory mats by the respective four memory mats,
   wherein each of the second wirings continuously extends over the respective four memory mats, and
   wherein each of the second wirings are divided every the four memory mats.

6. A device comprising:
   a plurality of first memory mats arranged on a first line in a first direction; and
   a plurality of word driver selection lines each including a first wiring extending in a second direction perpendicular to the first direction and a second wiring extending on a second line in the first direction, each of the second wirings of the plurality of word driver selection lines being provided to segment the plurality of first memory mats into a plurality of groups of the first memory mats, each of the plurality of groups of the first memory mats including four mats, and each of the plurality of word driver selection lines has access to the plurality of first memory mats by the respective four memory mats,
   a plurality of second memory mats arranged on a third line in the first direction;
   wherein the plurality of word driver selection lines further includes a plurality of third wirings, each of the plurality of third wirings of the plurality of word driver selection lines being provided to segment the plurality of the second memory mats into a plurality of groups of the second memory mats, the plurality of groups of the second memory mats corresponding to the plurality of groups of the first memory mats, respectively.

7. A device comprising:
   first to fourth memory mats arranged in that order on a first line extending in a first direction;
   first to fourth sub word driver regions arranged in that order on a second line extending in the first direction, the first to fourth sub word driver regions and the first and fourth sub word driver regions being arranged respectively in a second direction perpendicular to the first direction;
   first to fourth driver circuits arranged in that order on a third line extending in the first direction;
   first to fourth word driver selection lines, each of the first to fourth word driver selection lines including a first wiring and a second wiring, the first wiring of each of the first to fourth word driver selection lines extending in the second direction from the first to fourth driver circuits respectively, the second wirings of each of the first to fourth word driver selection lines continuously extending in the first direction over the first to fourth sub word driver regions and coupled to the first to fourth word driver selection lines respectively;
   a main word line extending in the first direction; and
   first to fourth sub word drivers each provided in the first to fourth sub word driver regions respectively to drive a plurality of sub word lines in the respective first to fourth memory mats based on an activation of the main word line and activation of the respective first to fourth driver circuits.

8. The device as claimed in claim 7, the device further comprising:
   a first decoder coupled to drive the main word line based on a first portion and a second portion of an address signal; and
   a second decoder configured to drive the first to fourth word driver selection lines via the first to fourth sub word drivers respectively based on the first portion and a third portion of the address signal, and independent of the second portion of the address signal.

9. The device as claimed in claim 8, wherein the first, second and third portions of the address signal are different from one another.

10. The device as claimed in claim 8, the device further comprising:
    first and second power source wirings extending in the first direction,
    wherein the main word line is sandwiched between the first and second power source wirings.

11. The device as claimed in claim 7,
    wherein the first wirings of the first to fourth word driver selection lines are formed over the respective first to fourth memory mats.

12. The device as claimed in claim 7, the device further comprising:
- a first group of memory mats and a second group of memory mats arranged such that the first to fourth memory mats are sandwiched between the first group of memory mats and the second group of memory mats, each of the first and second groups including four memory mats, the four memory mats of the first group of memory mats and the four memory mats of the second group of memory mats being arranged on the first line,
- a first group of word driver selection lines formed over the first group of memory mats for driving the first group of memory mats; and
- a second group of word driver selection lines formed over the second group of memory mats for driving the second group of memory mats,
- wherein the first and second groups of word driver selection lines are divided from the first to fourth word driver selection lines.

13. A device comprising:
- a plurality of memory mats arranged in matrix of first to fourth column and first and fourth row;
- a plurality of sub word driver regions arranged in matrix of first to fourth column and first and fourth row where a plurality of sub word drivers are provided in the respective sub word driver regions to drive memory cells in the respective memory mats;
- first to eighth driver circuits; and
- first to eighth word driver selection lines each extending from the respective first to eighth driver circuits, first and second word driver selection lines extending corresponding to the memory mats at the first column, third and fourth word driver selection lines extending corresponding to the memory mats at the second column, fifth and sixth word driver selection lines extending corresponding to the memory mats at the third column, seventh and eighth word driver selection lines extending corresponding to the memory mats at the fourth column,
- the first word driver selection line including a first and second branches extending corresponding to the four memory mats at the first and third rows over the sub word driver regions at the first and third rows respectively,
- the second word driver selection line including a first and second branches extending corresponding to the four memory mats at the second and fourth rows over the sub word driver regions at the second and fourth rows respectively,
- the third word driver selection line including a first and second branches extending corresponding to the four memory mats at the first and third rows over the sub word driver regions at the first and third rows respectively,
- the fourth word driver selection line including a first and second branches extending corresponding to the four memory mats at the second and fourth rows over the sub word driver regions at the second and fourth rows respectively,
- the fifth word driver selection line including a first and second branches extending corresponding to the four memory mats at the first and third rows over the sub word driver regions at the first and third rows respectively,
- the sixth word driver selection line including a first and second branches extending corresponding to the four memory mats at the second and fourth rows over the sub word driver regions at the second and fourth rows respectively,
- the seventh word driver selection line including a first and second branches extending corresponding to the four memory mats at the first and third rows over the sub word driver regions at the first and third rows respectively, and
- the eighth word driver selection line including a first and second branches extending corresponding to the four memory mats at the second and fourth rows over the sub word driver regions at the second and fourth rows respectively.

14. The device as claimed in claim 13,
- wherein a main word line is driven based on a first portion and a second portion of an address signal,
- wherein the first to eighth word driver selection lines are driven based on the first portion and a third portion of an address signal, and independent of the second portion of the address signal.

15. The device as claimed in claim 14, wherein the first, second and third portions of the address signal are different from one another.

16. The device as claimed in claim 14, the device further comprising:
- first and second power source wirings extending in the first direction,
- wherein the main word line extends in the first direction and is sandwiched between the first and second power source wirings.

* * * * *